(12) United States Patent
Takahashi

(10) Patent No.: US 7,416,970 B2
(45) Date of Patent: *Aug. 26, 2008

(54) METHOD FOR MANUFACTURING SEMICONDUCTOR DEVICE

(75) Inventor: Tomishi Takahashi, Yonezawa (JP)

(73) Assignee: Renesas Technology Corp., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 11/750,042

(22) Filed: May 17, 2007

(65) Prior Publication Data

US 2007/0212821 A1    Sep. 13, 2007

Related U.S. Application Data

(63) Continuation of application No. 10/516,257, filed as application No. PCT/JP03/004903 on Apr. 17, 2003, now Pat. No. 7,226,815.

(30) Foreign Application Priority Data

May 31, 2002    (JP)    ............................. 2002-159012

(51) Int. Cl.
*H01L 21/44*    (2006.01)

(52) U.S. Cl. ....................................... 438/617

(58) Field of Classification Search ................. 438/617, 438/612
See application file for complete search history.

(56) References Cited

U.S. PATENT DOCUMENTS

| | | | |
|---|---|---|---|
| 5,189,280 A | 2/1993 | Okazaki et al. | |
| 6,337,105 B1 | 1/2002 | Kunieda et al. | |
| 2001/0026991 A1* | 10/2001 | Ichikawa et al. | ............ 438/411 |
| 2001/0033592 A1 | 10/2001 | Yamauchi et al. | |
| 2002/0028524 A1 | 3/2002 | Koduri | |
| 2005/0077623 A1 | 4/2005 | Roberts et al. | |
| 2006/0131601 A1 | 6/2006 | Ouderkirk et al. | |

FOREIGN PATENT DOCUMENTS

| | | |
|---|---|---|
| JP | 60-247487 | 12/1985 |
| JP | 5-109808 | 4/1993 |
| JP | 6-104319 | 4/1994 |
| JP | 7-147297 | 6/1995 |
| JP | 2000-332050 | 11/2000 |
| JP | 2001-314993 | 11/2001 |
| JP | 2002-158255 | 5/2002 |

* cited by examiner

*Primary Examiner*—Thao Le
(74) *Attorney, Agent, or Firm*—Antonelli, Terry, Stout & Kraus, LLP.

(57) ABSTRACT

A manufacturing method is for providing an excellent wire bonding property in the manufacturing of a semiconductor device using an organic resin wiring substrate. In the manufacturing of the semiconductor device, a thermosonic wire bonding apparatus is used when the electrodes of a semiconductor element fixed to the principal surface of a substrate are connected to lines on the substrate with wires. To connect the first and second portions to be bonded of the substrate placed on a wire bonding stage with wires each held by a capillary, the wire bonding apparatus heats the capillary to a specified temperature by irradiating the capillary with a laser beam for a given period of time immediately before first bonding for connecting the wire to the first portion to be bonded and immediately before second bonding for connecting the wire to the second portion to be bonded and heats the portions of the wires to be bonded with the resulting heat, thereby connecting the wires to predetermined portions by using thermocompression and ultrasonic vibration.

4 Claims, 18 Drawing Sheets

METHOD FOR MANUFACTURING SEMICONDUCTOR DEVICE

This application is a Continuation application of application Ser. No. 10/516,257, filed Nov. 30, 2004, now U.S. Pat. No. 7,226,815 the contents of which are incorporated herein by reference in their entirety. Ser. No. 10/516,257 is a National Stage Application, filed under 35 USC 371, of International (PCT) Application No. PCT/JP03/004903, filed Apr. 17, 2003.

TECHNICAL FIELD

The present invention relates to a method for manufacturing a semiconductor device and, more particularly, to a technology which is effective when applied to a technique for connecting leads to electrodes with wires by thermosonic wire bonding.

BACKGROUND ART

In the case of providing connection between two points with a conductive wire in the manufacturing of a semiconductor device (integrated circuit device), a wire bonding apparatus has been used. For example, when a semiconductor device is manufactured by using a lead frame having a tab and a plurality of leads extending toward the tab, a semiconductor element (semiconductor chip) is fixed to the principal surface of the tab and then the electrodes of the semiconductor chip are connected to the leads with conductive wires.

In wire bonding, a technology which applies heat and a technology which applies heat and ultrasonic vibration have been known to achieve a satisfactory bonding strength when connection is provided by physically squashing the wires. A system for the former technology is termed a thermocompression wire bonding apparatus and a system for the latter technology is termed a thermosonic wire bonding apparatus.

Thermosonic wire bonding apparatus are disclosed in, e.g., Japanese Unexamined Patent Publications No. Hei 7 (1995)-147297 and No. 2000-332050. Each of these documents discloses a technology which sprays a cooled air to a horn to suppress a reduction in bonding accuracy resulting from the heat-induced expansion of the horn. The former one of the documents discloses a technology which sprays a cooled air to a portion including the body tube of a sensing camera and a camera support arm for supporting the sensing camera.

As for the technology for heating a wire, it is disclosed in, e.g., Japanese Unexamined Patent Publication No. Hei 6 (1994)-104319. In one of the wire heating methods disclosed in the document, a wire bonding tool (capillary) is constructed such that a laser absorption film is provided on the wire compression surface of the tool, while a laser reflection film is provided on the surface of the tool except for the wire compression surface and a surface on which a laser beam is incident, and a laser beam incident upon the tool is focused on the absorption film to apply heat, which is conducted from the absorption film directly to the wire. However, the bonding tool is complicated in structure and high in manufacturing cost.

On the other hand, an organic resin wiring substrate such as an epoxy resin substrate containing glass has been used as a device substrate which is a component of a semiconductor device. As for the organic resin wiring substrate, it is described at pages 16-30 of the October 2001 issue of Electronic Materials, published by Kogyochosakai Publishing Co., Ltd.

Each of a thermocompression wire bonding apparatus and a thermosonic wire bonding apparatus performs wire bonding by placing a lead frame and a wiring substrate on a wire bonding stage in a heated state. If a copper plate having a large thermal expansion coefficient is used as the lead frame, the lead frame is prone to thermal deformation and therefore high-accuracy wire bonding could not be performed.

In an organic resin wiring substrate using an organic resin in the base material or surface portion thereof also, a line on the surface thereof elongates due to the considerable thermal expansion of the organic resin and therefore high-accuracy wire bonding could not be performed.

Against the deformation resulting from the thermal expansion of the wiring substrate or the lead frame, measures can be taken in which the position of a line or lead as a wire bonding target is recognized prior to a wire bonding step, and a bonding position is corrected. However, once a holder for holding a camera or a horn for holding a capillary for performing wire bonding is expanded by radiated heat resulting from the heating of the wire bonding stage and displaced, the problem of an inevitable reduction in wire bonding accuracy occurs unless a mechanism for correcting the displacement thereof is provided.

It has also been proved that the use of an organic resin wiring substrate generates an organic gas and reduces wire bondability, as has been described in the specification of the invention already applied for patent by the present inventors.

That is, an insulating layer is formed on the surface of a wiring substrate (organic resin wiring substrate) such as an epoxy substrate containing glass used for a semiconductor device or in the inside thereof. For example, there is a wiring substrate having an insulating film such as a solder resist film for insulating surface lines which is formed on the surface thereof and also an insulating layer made of an epoxy material serving as a base material which is disposed in the inside of the wiring substrate. The insulating layer of such a wiring substrate is formed mainly from an organic resin.

In a wire bonding step, the wiring substrate is heated to a high temperature so that an organic gas is generated from the insulating layer. The organic gas is cooled by each of the parts of the apparatus arranged around the wiring substrate and deposited as an organic substance. There is a risk that, if the organic substance is deposited on each of the parts of the wire bonding apparatus, the apparatus might not operate smoothly. If an organic substance adheres to a cylindrical capillary which is holding a wire, the wire is not smoothly fed out of the capillary any more and excellent wire bonding cannot be performed.

An object of the present invention is to provide a method for manufacturing a semiconductor device which provides an excellent wire bonding property.

The above and other objects and novel features of the present invention will become apparent from the description of the present specification and the accompanying drawings.

DISCLOSURE OF THE INVENTION

A brief description will be given to the outline of the representative aspects of the present invention disclosed in the present application.

(1) In accordance with the present invention, a thermosonic wire bonding apparatus is used when the electrodes of a semiconductor device fixed to the principal surface of a substrate and lines on the substrate are connected with wires in the manufacturing of the semiconductor device. The wire bonding apparatus connects the first and second bonded portions of the substrate placed on a wire bonding stage with wires each held in a capillary, irradiates the capillary with a laser beam for a specified period of time to heat the capillary to a specified temperature immediately before each of first bonding for bonding the wire to the first bonded portion and second bonding for bonding the wire to the second bonded portion, and thereby heats the portions of the wires to be bonded with the accumulated heat to connect the wires to predetermined portions by using thermocompression and ultrasonic vibration. The capillary is formed from an insulating ceramic having a heat accumulating effect and a low thermal conductivity.

The wire bonding apparatus is constructed such that, in a wire bonding operation, the dose of laser beam irradiation immediately before each of one to a plurality of wire bonding steps including the first one is higher than the dose of laser beam irradiation immediately before any of the subsequent wire bonding steps. The wire bonding apparatus is also constructed such that, at the reactivation of the wire bonding apparatus after an interrupted operation also, the dose of laser beam irradiation immediately before each of one to a plurality of wire bonding steps including the first one is higher than the dose of laser beam irradiation immediately before any of the subsequent wire bonding steps. The wire bonding apparatus is provided with a laser beam shield cover for shielding a laser beam from being scattered to the outside.

(2) In the structure of the means (1), a heating device has been incorporated in the wire bonding stage to heat the substrate at a temperature not more than 130° C.

With the means (1), (a) wire bonding is performed by heating the capillary through laser beam irradiation immediately before wire bonding so that it is unnecessary to heat the wire bonding stage. Accordingly, the substrate on the wire bonding stage is no more heated and the heat-induced expansion or deformation of the substrate is less likely to occur. Since the laser beam irradiation is local, there is no risk that a surrounding portion is heated thereby. Consequently, the heat-induced expansion of the horn supporting the capillary or an optical system for monitoring the substrate portion is also less likely to occur, which enables high-accuracy wire bonding. As a result, a yield is increased and a high-quality semiconductor device can be manufactured at low cost.

(b) In the wire bonding apparatus, the dose of laser beam irradiation for each of the first one to plurality of wire bonding steps is increased in the wire bonding operation. This allows excellent wire bonding since the capillary heated from a room temperature to a specified temperature is sufficiently heated even at the initial stage. In addition, the dose of laser beam irradiation is lowered thereafter so that the degradation of a wire bonding property is no more induced by excessive heating of the wire. This enables high-accuracy wire bonding and allows the manufacturing of a high-quality semiconductor device.

(c) At the time of resuming the interrupted operation also, the dose of laser beam irradiation for each of the first one to plurality of wire bonding steps is also increased and reduced thereafter, in the same manner as described in (b). This constantly enables excellent wire bonding and allows the manufacturing of a high-quality semiconductor device.

(d) Since the wire bonding apparatus is provided with the laser beam shield cover for shielding a laser beam from being scattered to the outside, an operator is protected from the scattered laser beam so that safety is guaranteed.

Besides the effects achieved by the means (1), the means (2) achieves the following effects. Since the heating device has been incorporated in the wire bonding stage to heat the substrate at a temperature not more than 130° C., it becomes possible to (a) reduce the output of a laser beam irradiation mechanism for heating the capillary and reduce the dose of laser beam irradiation (irradiation period).

(b) Even when a copper lead frame having a large thermal expansion coefficient is used as the substrate, the elongation of each of the parts due to thermal expansion is slight and the bonding position is precise, which enables high-accuracy wire bonding and achieves a yield increase. As a result, it becomes possible to manufacture a high-quality semiconductor device at low cost.

(c) Even when an organic resin wiring substrate is used as the substrate, the organic resin wiring substrate is heated only to a temperature not more than 130° C. As a result, an organic gas is no more generated and a defect resulting from the adhesion of the organic gas no more occurs, which enables excellent wire bonding. In addition, the heating temperature is low, the elongation of a line resulting from thermal expansion is slight, and the bonding position is precise in the same manner as in the case of using the copper lead frame. This enables high-accuracy wire bonding.

BEST MODE FOR CARRYING OUT THE INVENTION

Figure 1:
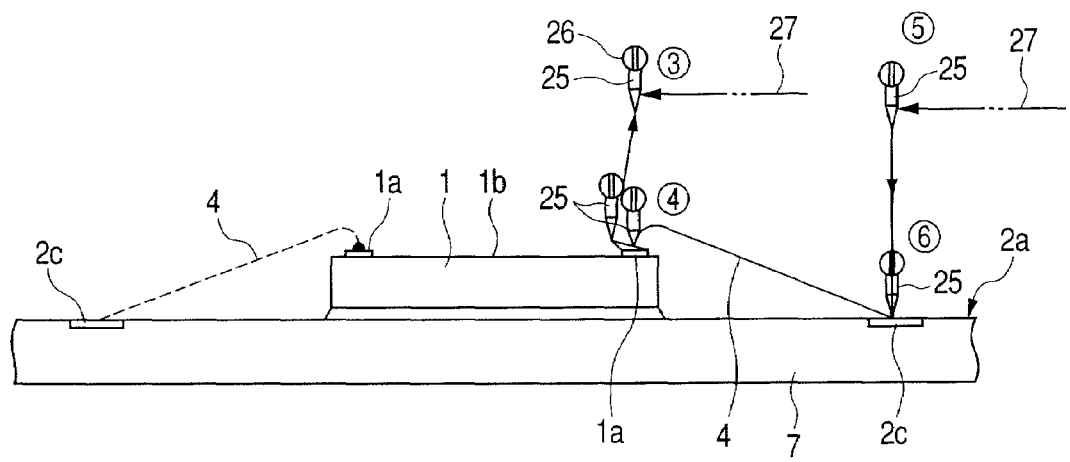
FIG. 1 is a schematic diagram illustrating a wire bonding operation in a method for manufacturing a semiconductor device according to an embodiment (Embodiment 1) of the present invention.

Referring to the drawings, the embodiments of the present invention will be described in detail herein below. Throughout all the drawings for illustrating the embodiments of the present invention, parts having the same function are designated by the same reference numerals and the repeated description thereof will be omitted.

Embodiment 1

Figure 4:
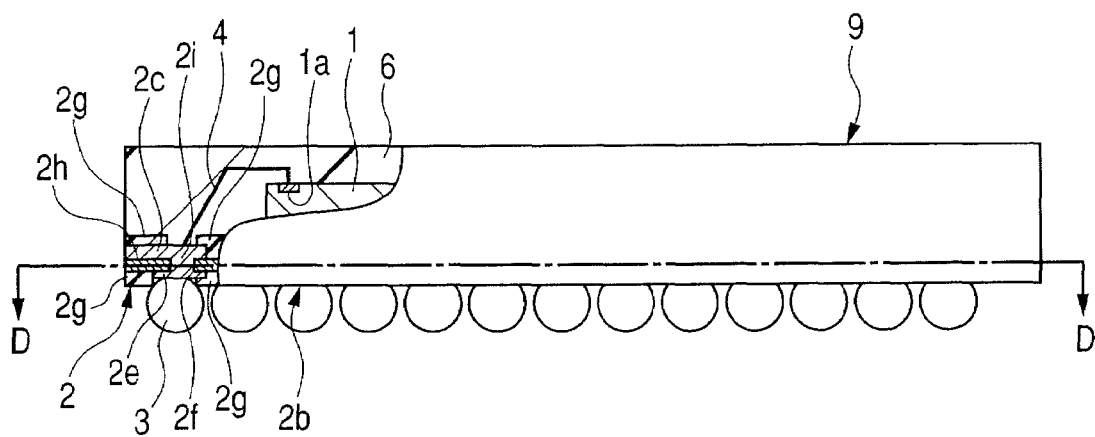
FIG. 4 is a schematic front view partly including a cross section of the BGA semiconductor device.
Figure 5:
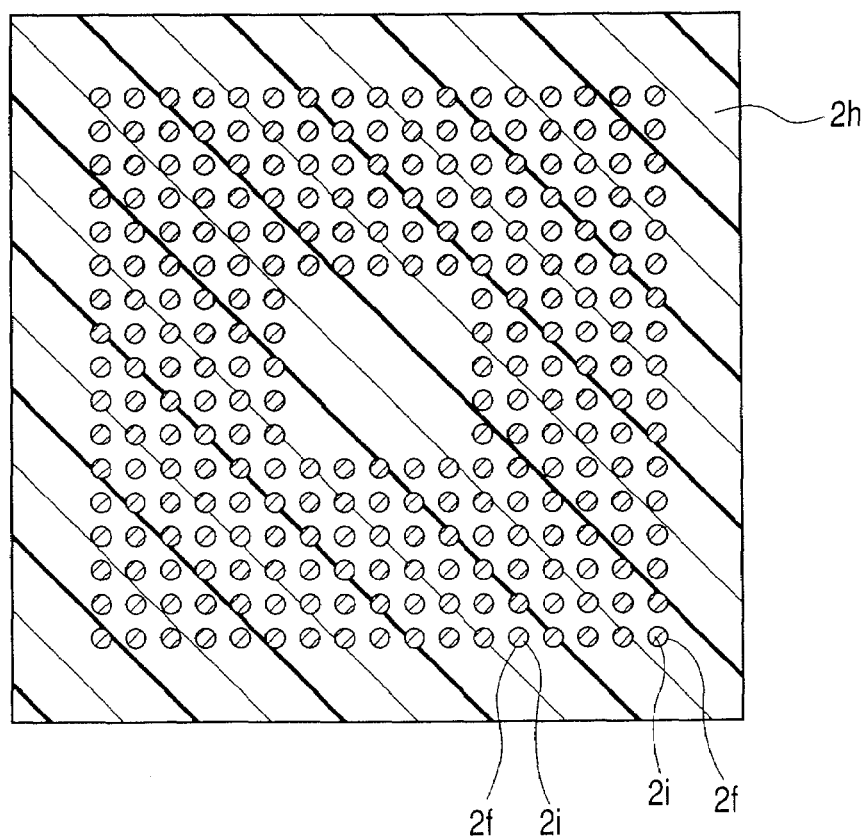
FIG. 5 is a schematic cross-sectional view taken along the line D-D of FIG. 4.
Figure 6:
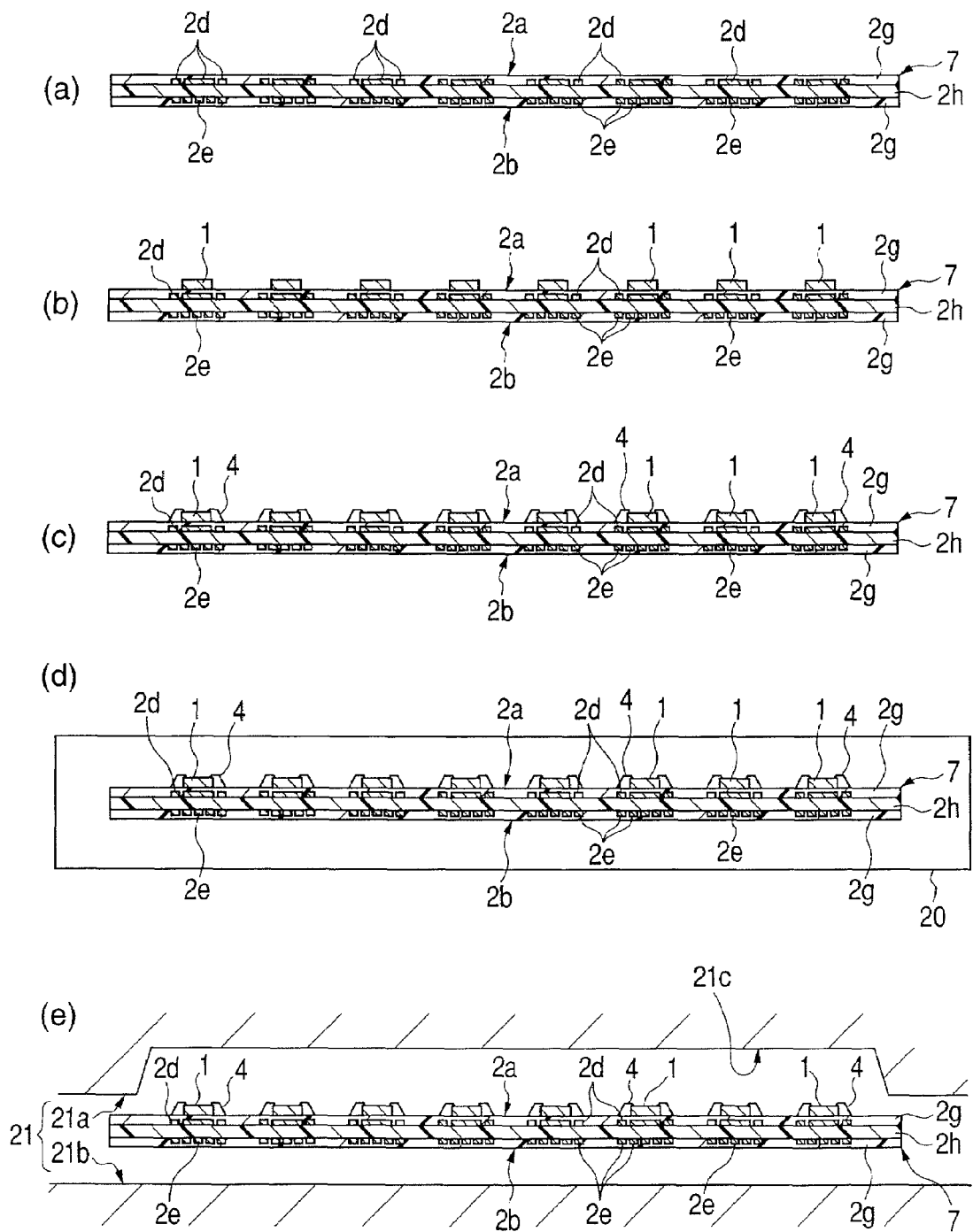
FIGS. 6(a) to 6(e) are cross-sectional views illustrating a process from the step of preparing a wiring substrate to a resin molding step in the method for manufacturing the BGA semiconductor device.
Figure 7:
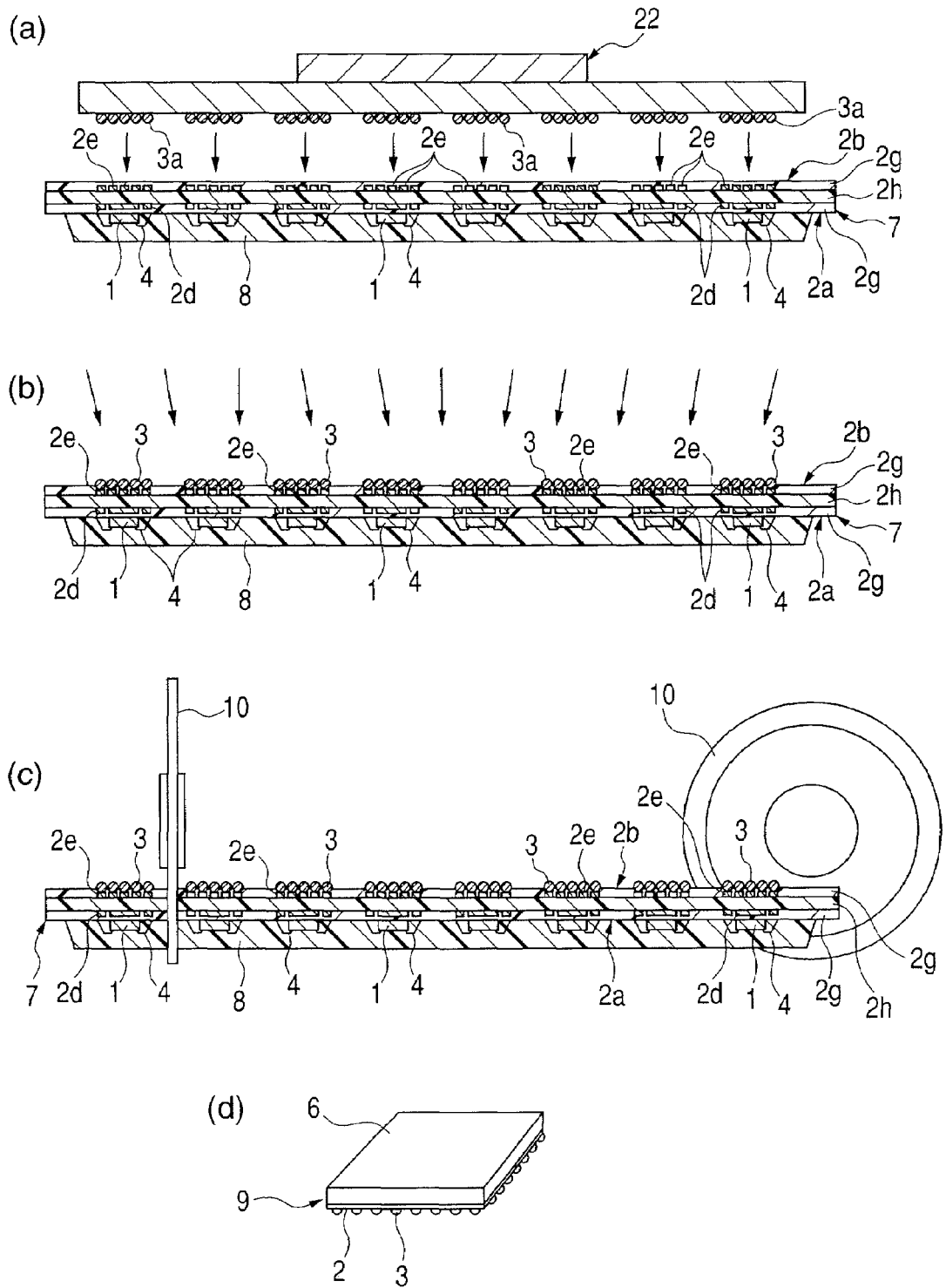
FIGS. 7(a) to 7(d) are cross-sectional views illustrating a process from the step of mounting solder bumps to the step of obtaining the BGA semiconductor device in the method for manufacturing the BGA semiconductor device.
Figure 8:
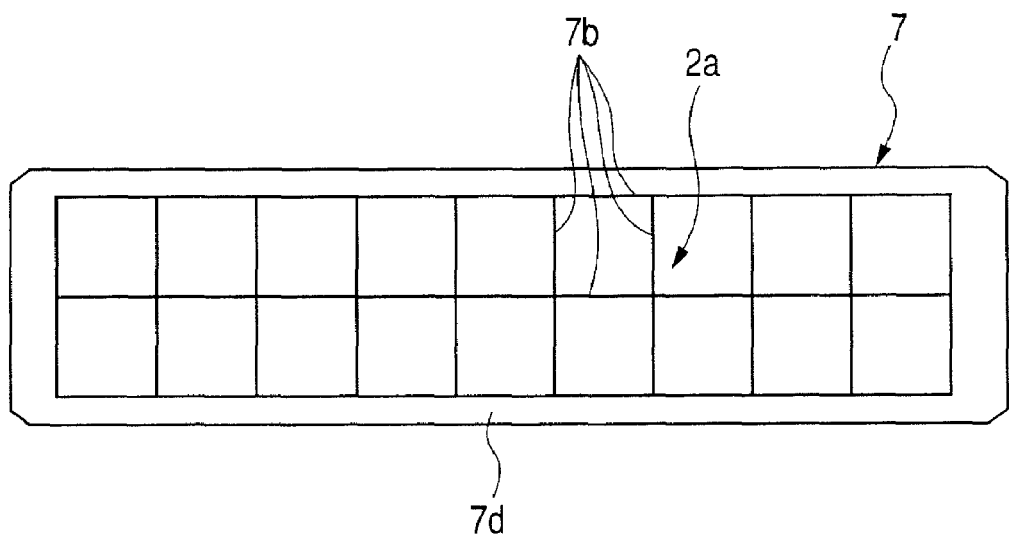
FIG. 8 is a schematic plan view showing the principal surface of a wiring substrate (multi-chip substrate) used in the manufacturing of the BGA semiconductor device.

FIGS. 1 to 22 are views related to a method for manufacturing a semiconductor device as an embodiment (Embodiment 1) of the present invention. FIG. 1 is a schematic diagram illustrating a wire bonding operation in the method for manufacturing a semiconductor device. FIGS. 2 to 5 are views related to a BGA semiconductor device manufactured in Embodiment 1. FIGS. 6 and 7 are cross-sectional views illustrating the individual steps of manufacturing the BGA semiconductor device. FIGS. 8 to 11 are views related to a wiring substrate used in the manufacturing of the BGA semiconductor device. FIGS. 12 to 22 are views related to a wire bonding apparatus used in the manufacturing of the BGA semiconductor device.

The present invention is applicable to a method for manufacturing a semiconductor device by using a metal lead frame and a wiring substrate. In Embodiment 1, however, a description will be given to an example in which the present invention is applied to a method for manufacturing a semiconductor device by using a wiring substrate, particularly a wiring substrate containing an organic resin (organic resin wiring substrate). In particular, an example in which the present invention is applied to the manufacturing of a semiconductor device termed a BGA (Ball Grid Array) type will be described.

Figure 2:
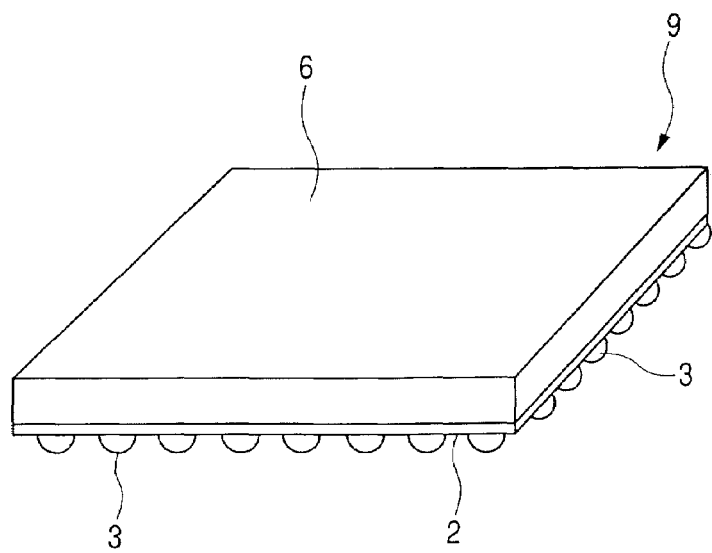
FIG. 2 is a perspective view showing the outer appearance of a BGA semiconductor device manufactured in accordance with the method for manufacturing a semiconductor device according to Embodiment 1.
Figure 3:
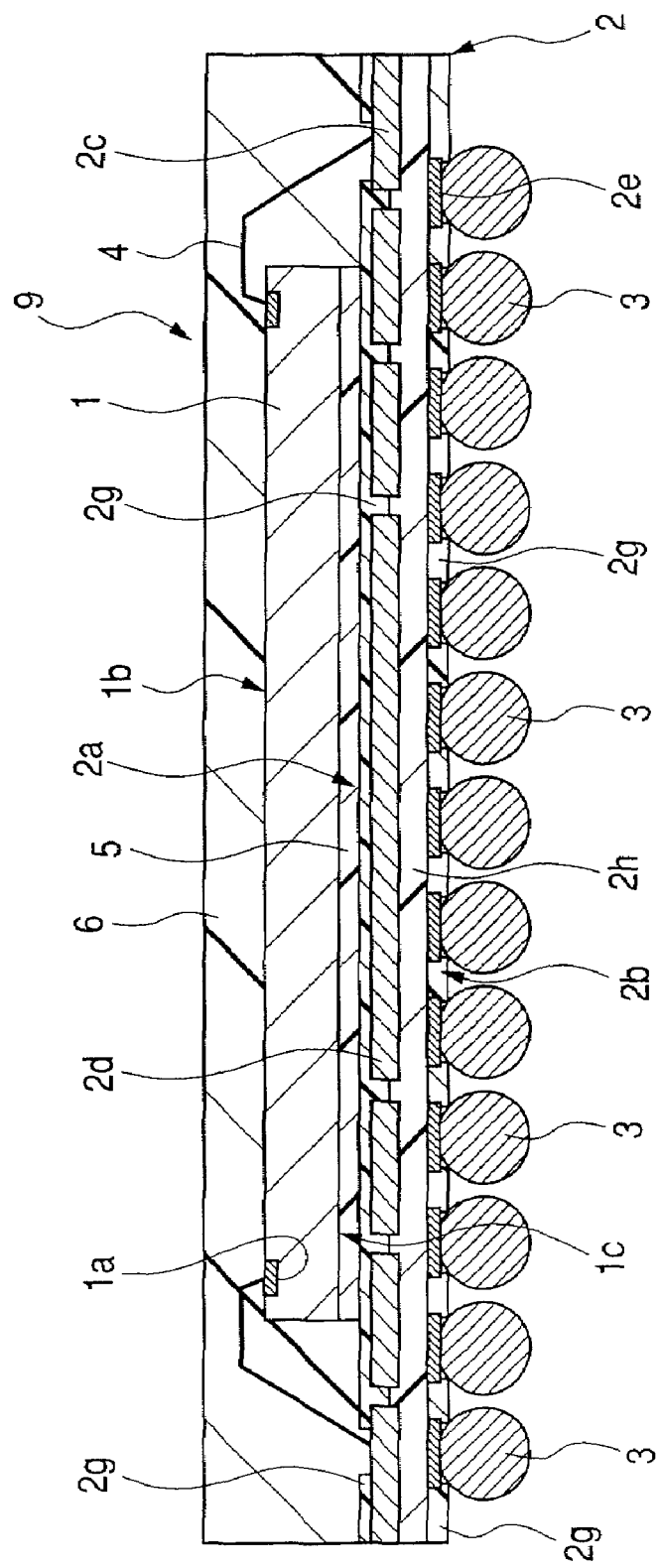
FIG. 3 is a schematic cross-sectional view of the BGA semiconductor device.

Before describing the method for manufacturing a semiconductor device according to Embodiment 1, a description will be given to a manufactured semiconductor device with reference to FIGS. 2 to 5. FIG. 2 is a perspective view showing the outer appearance of the BGA semiconductor device. FIG. 3 is a schematic cross-sectional view of the BGA semiconductor device. FIG. 4 is a schematic front view partly including a cross section of the BGA semiconductor device. FIG. 5 is a schematic cross-sectional view taken along the line D-D.

The BGA semiconductor device 9 manufactured in accordance with the method for manufacturing a semiconductor device according to Embodiment 1 has an external structure having a quadrilateral package substrate 2, a molded body 6 comprised of an insulating resin formed on the package substrate 2, and a plurality of ball electrodes 3 provided on the back surface of the package substrate 2, as shown in FIG. 2. The ball electrodes 3 are arranged as an array comprised of a plurality of rows/columns on the back surface 2b of the package substrate 2 as the wiring substrate, as shown in FIG. 4.

In Embodiment 1, the wiring substrate used during the manufacturing of the semiconductor device has a structure (matrix structure) in which product forming portions are arranged in rows and columns. Embodiment 1 is for manufacturing a large number of semiconductor devices by fixing semiconductor elements onto the respective product forming portions of the principal surface of the wiring substrate, connecting the electrodes of the semiconductor elements and lines with wires, forming an insulating resin layer on each of the product forming portions, forming the ball electrodes on the back surface of the wiring substrate, and then cutting the wiring substrate and the resin molded body in vertical and lateral directions along the individual product forming portions. Consequently, the package substrate 2 and the molded body 6 have the respective outer circumferential surfaces thereof positioned on the same plane.

Since the method for manufacturing a semiconductor device according to Embodiment 1 uses a wiring substrate (organic resin wiring substrate) for providing multiple chips on which the product forming portions are arranged as a matrix, the wiring substrate will be termed the multi-chip substrate and the wiring substrate in a product state will be termed the package substrate. The present invention is also applicable to the case where a semiconductor device is manufactured by using a wiring substrate for a single chip without using the multi-chip substrate. Accordingly, the multi-chip substrate, the package substrate, and the single-chip wiring substrate will be termed generally as substrates.

Since the present invention is also applicable to a method for manufacturing a semiconductor device using a lead frame having a tab and a plurality of leads having the tips thereof facing the tab from therearound, the lead frame will be termed a substrate in the method for manufacturing a semiconductor device using the lead frame. In this case, a mounting portion used in the description of Embodiment 1 to which the semiconductor elements are fixed corresponds to the tab of the lead frame and lines (connection terminals) arranged around the mounting portion correspond to the leads having the tips thereof facing the tab from therearound.

As shown in FIGS. 3 and 4, the package substrate 2 has a base material 2h made of an epoxy resin (organic resin) containing glass. The lines are formed selectively on the principal surface (which is the upper surface in FIGS. 3 and 4) of the base material 2h. As shown in FIG. 3, lines (connection terminals) 2c to be connected to wires are provided externally of the region to which the semiconductor chips are fixed and lines 2d are also formed internally thereof. A solder resist 2g (insulating layer) made of a polyimide resin (organic resin) is formed selectively on these lines 2c and 2d. The lines (connection terminals) 2c have only the peripheries thereof covered with the solder resist 2g to form the lines (connection terminals) 2c to be connected to the wires.

In addition, bump lands 2e are formed selectively on the back surface (which is the lower surface in FIGS. 3 and 4) of the base material 2h and the back surface of the base material 2h including the peripheries of the bump lands 2e is covered with the solder resist 2g. As shown in FIG. 4, via holes (through holes) 2f are provided selectively in the base material 2h and via hole lines 21 are filled in the respective via holes (through holes) 2f to provide electrical connection between the bump lands 2e and the lines (connection terminals) 2c.

The ball electrodes (solder bumps) 3 are electrically connected as external electrode terminals to the back surface 2b of the package substrate 2. The ball electrodes 3 are arranged as an array because the via hole lines 21 connecting to the bump lands 2e are arranged as an array, as shown in FIG. 5. In terms of the number of external electrode terminals, however, the via hole lines 21 and the bump lands 2e are not provided at the center portion of the back surface 2b of the package substrate 2 so that the ball electrodes 3 are not provided at the center portion of the back surface 2b of the package substrate 2, as shown in FIG. 5.

As shown in FIG. 3, a semiconductor chip 1 has been fixed to the principal surface 2a of the package substrate 2 via a back surface 1c by using a bonding material 5. The semiconductor chip 1 is formed from, e.g., silicon or the like and a semiconductor integrated circuit is formed on the principal surface 1b thereof. The electrodes (pads) 1a of the semiconductor chip 1 have been connected electrically to the lines (connection terminals) 2c of the package substrate 2 with wires (bonding wires) 4 comprised of Au wires. It follows therefore that the specified electrodes 1a of the semiconductor chip 1 are connected electrically to the predetermined ball electrode 3, as shown in FIG. 4.

As shown in FIG. 3, the principal surface of the package substrate 1 is covered end-to-end with the molded body 6 comprised of an insulating resin. The molded body 6 has a structure completely covering the semiconductor chip 1, the bonding wires 4, and the like. In Embodiment 1, the resin molded body 6 is formed by transfer molding to have a flat surface (principal surface) due to the configuration of a cavity in a molding die used for transfer molding and have an equal thickness all over.

A description will be given next to the process of manufacturing the BGA semiconductor device according to Embodiment 1 with reference to FIGS. 6(a) to 6(e) and FIGS. 7(a) to 7(d). In the description of the process, some of reference numerals in the drawings are omitted. The description will be given to the wiring substrate with reference to FIGS. 8 to 11 and to wire bonding and a wire bonding apparatus with reference to FIG. 1 and FIGS. 12 to 22.

In the manufacturing of the BGA semiconductor device 9 according to Embodiment 1, a multi-chip substrate 7 is prepared first as shown in FIG. 6(a). As shown in FIGS. 8 to 11, the multi-chip substrate 7 has a structure in which product forming portions 7a are formed as a matrix on each of the principal surface 2a and the back surface 2b. Although the product forming portions 7a are formed in 2 rows and 9 columns in Embodiment 1, the numbers of rows and columns are not limited thereto.

Each of the product forming portions 7a has a quadrilateral configuration and the lines along the individual edges of the product forming portions 7a become dicing lines 7b serving as cut regions. When the multi-chip substrate 7 is cut by using a dicing blade of a dicing system, the multi-chip substrate 7 undergoes end-to-end cutting. In the drawings, the dicing lines 7b only in the product forming portions 7a are shown.

Figure 9:
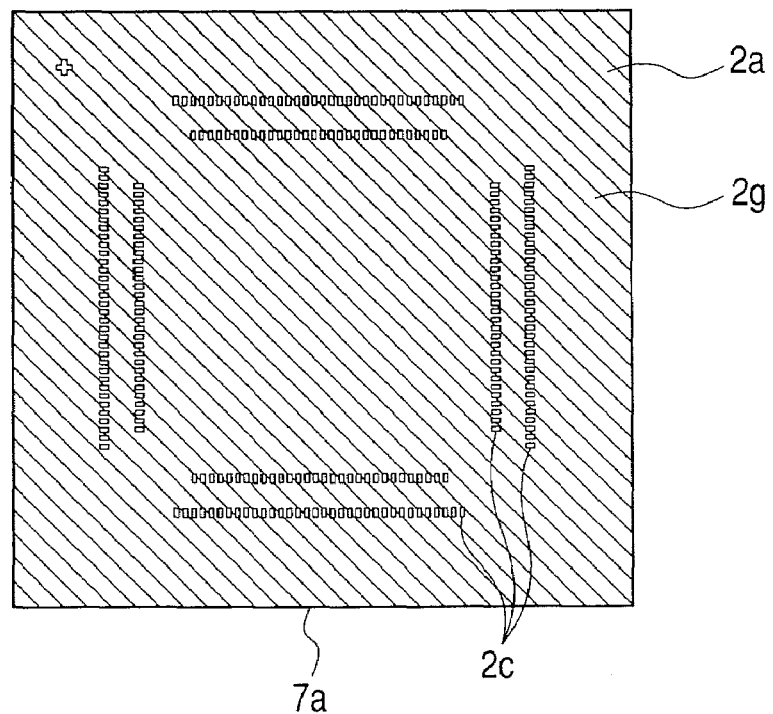
FIG. 9 is a schematic plan view showing the principal surface of the product forming portion of the multi-chip substrate.
Figure 10:
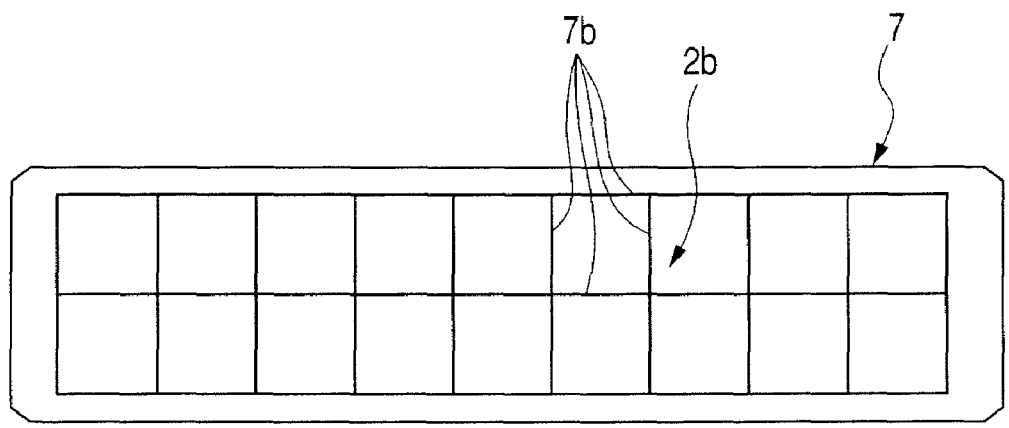
FIG. 10 is a schematic bottom view showing the back surface of the multi-chip substrate used in the manufacturing of the BGA semiconductor device.
Figure 11:
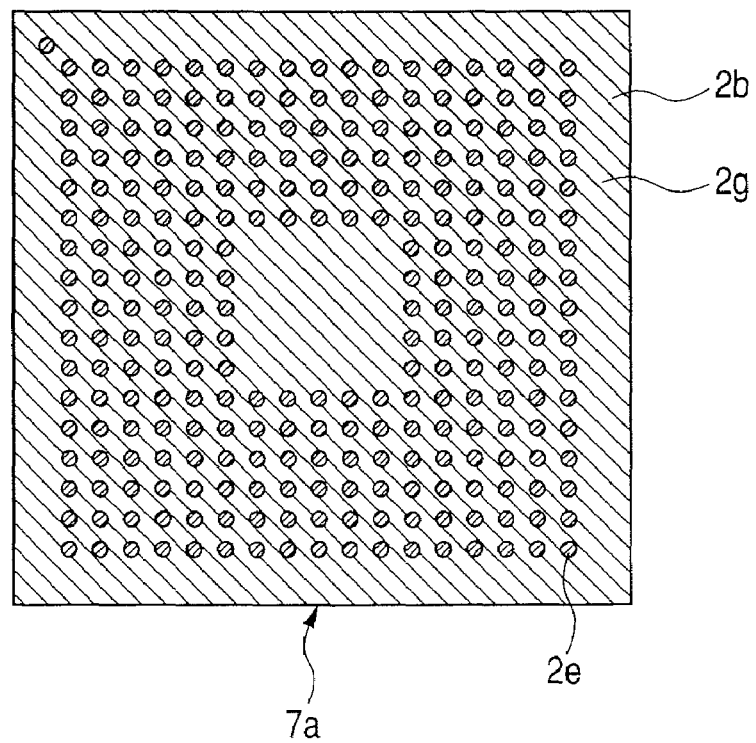
FIG. 11 is a schematic bottom view showing the back surface of each of the product forming portions of the multi-chip substrate.

On the principal surface of each of the product forming portions 7a, the lines (connection terminals) 2c for connecting the wires are arranged with a given pitch in two rows in a frame-like configuration in such a manner as to surround a quadrilateral mounting portion to which the semiconductor chip is fixed, as shown in FIG. 9. The surface is covered with the solder resist 2g except for the lines (connection terminals) 2c. At the back surface of each of the product forming portions 7a, the bump lands 2e are arranged as a matrix, as shown in FIG. 11. The bump lands 2e are not provided at the center portion in terms of the number of the external electrode terminals. The back surface is also covered with the solder resist 2g except for the bump lands 2e. As for the multilayer structure of each of the product forming portions 7a, the description thereof will be omitted since it has already been described.

Next, as shown in FIG. 6(b), the semiconductor chips 1 are fixed (mounted) on the respective product forming portions 7a of the principal surface of the multi-chip substrate 7 via the bonding material 5 (see FIG. 3). In the drawing, the reference numeral of the bonding material 5 has been omitted.

Next, as shown in FIG. 6(c), the electrodes (pads) of the semiconductor chips 1 are connected to the lines (connection terminals) 2c with the wires (bonding wires) 4 (see FIG. 3). In the drawing, the reference numerals of the electrodes (pads) 1a and the lines (connection terminals) 2c are omitted. Wire bonding is performed by using the wire bonding apparatus shown in each of FIGS. 12 to 20. FIG. 1 shows a wire bonding operation.

In Embodiment 1, the wire bonding apparatus according to the present invention is used. Although the wire bonding apparatus described in Embodiment 1 is a thermosonic wire bonding apparatus, the present invention is also applicable to a thermocompression wire bonding apparatus.

FIG. 1 is a view schematically showing the characteristic content of a wire bonding method according to the present invention. In FIG. 1 are shown: the semiconductor chip 1 fixed to the principal surface of the multi-chip substrate 7 via the bonding material 5; the wires (connection terminals) 2c provided on the multi-chip substrate 7 to surround the semiconductor chip 1; and a capillary 25 for performing wire bonding by holding the wire 4. The electrodes (pads) 1a are provided on the principal surface 1b of the semiconductor chip 1.

Wire bonding normally includes first bonding (1stB) for bonding, e.g., the tip portion of the wire to the electrode 1a and second bonding (2ndB) for connecting the middle portion of the wire to the line (connection terminal) 2c. In the case of using the lead frame, the second bonding (2ndB) is performed with respect to the leads. The targets of the first bonding and the second bonding may also be switched. That is, it is also possible to perform the first bonding (1stB) with respect to the line 2c and perform the second bonding (2ndB) with respect to the electrode 1a.

The capillary 25 is held on the tip of a horn 26 and moves with the movement of the horn 26 to perform wire bonding.

Wire connection includes the steps of:

(i) holding the wire with the cylindrical capillary having a lower end surface serving as a wire compression surface;

(ii) forming the tip portion of the wire protruding from the wire compression surface of the capillary into a spherical configuration;

(iii) irradiating the capillary with a laser beam for a given period of time to heat the capillary and thereby heat the wire held thereby immediately before performing the first bonding;

(iv) operating the capillary to perform the first bonding;

(v) irradiating the capillary with a laser beam for a given period of time to heat the capillary and thereby heat the wire held thereby immediately before performing the second bonding;

(vi) operating the capillary to perform the second bonding; and (vii) pulling the wire to cut it at the vicinity of the second bonded portion.

In FIG. 1 are illustrated the respective states of: the irradiation of the capillary 25 with a laser beam 27 immediately before the first bonding in the step (iii); the first bonding in the step (iv); the irradiation of the capillary 25 with the laser beam 27 immediately before the second bonding in the step (v); the second bonding in the step (vi); and the connection of the electrode (pad) 1a as the first bonded portion to the line (connection terminal) 2c as the second bonded portion with the wire (bonding wire) 4. Although FIG. 1 illustrates the multi-chip substrate 7, reference numerals associated with the package substrate 2 are also shown in a part thereof since the drawing also illustrates the portion also serving as the package substrate 2.

After the second bonding, the wire 4 is clamped and pulled with a damper not shown such that the wire 4 is cut at the vicinity of the second bonded portion, whereby the bonding of one wire is completed.

If heating with the laser beam is sufficient, wire bonding can be performed without using another heating mechanism. However, it is difficult to obtain a sufficient bonding strength only with a laser beam so that it is effective to use other various means for increasing the bonding strength. Weighing and the application of an ultrasonic wave during bonding are extremely effective means particularly in terms of slight thermal influence on the ambient environment and a slight detriment caused by the concurrent use thereof.

If heating means, e.g., a bonding stage is not used for heating in the bonding step, air blowing for cooling the apparatus that has been used conventionally can be stopped. This is effective in providing a stable bonding strength particularly when the step of forming a spherical portion at the tip of an Au wire precedes the bonding step, since the spherical portion with a stable configuration can be formed.

If no means is provided for controlling the temperature of the wiring substrate or the lead frame, however, the temperature of the wiring substrate or the lead frame may be changed by a change in the ambient environment of the apparatus to adversely affect the bonded state. To stabilize the temperature of the wiring substrate or the lead frame, it is easy to use heat from the bonding stage. In this case also, however, the temperature of heating using the bonding stage should be reduced to a level which exerts only a slight adverse effect on the bonding accuracy. The heating temperature should at least be set lower than the temperature of the capillary during bonding. It was recognized by the present inventors that, when the temperature of the bonding stage is not more than 130° C., the influence of the thermal expansion of the optical system or horn on a reduction in bonding accuracy was slight. In the case of using a semiconductor chip with a narrow pitch in which the minimum pitch of bonding pads is not more than 65 µm, in particular, the temperature of the bonding stage is preferably adjusted to 100 to 70° C. to satisfy required bonding accuracy.

A description will be given herein to the wire bonding apparatus according to Embodiment 1 comprising a laser irradiation mechanism and a wire bonding stage for heating a wiring substrate to 130° C. or less.

Figure 13:
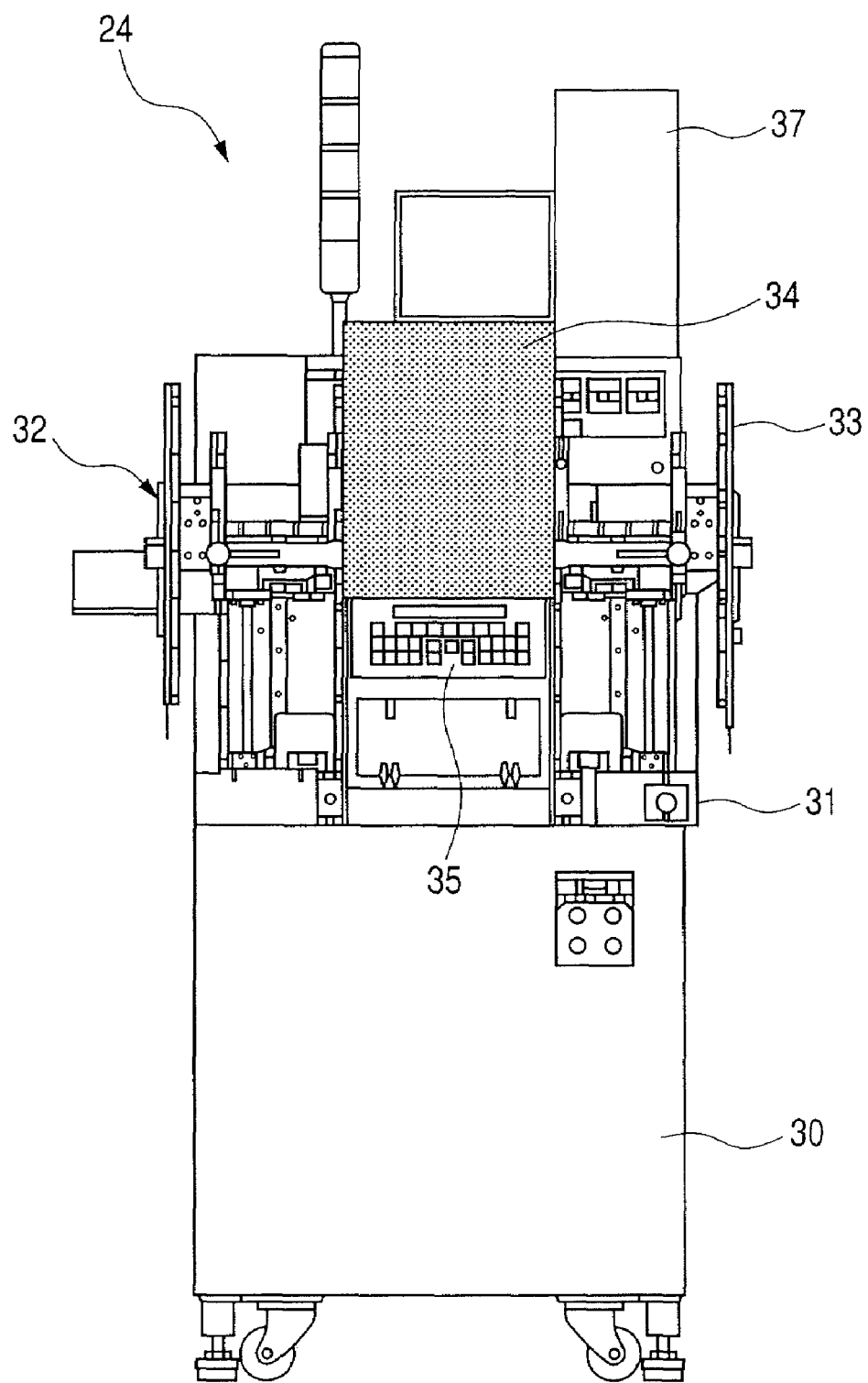
FIG. 13 is a front view showing the outer appearances of the wire bonding apparatus.
Figure 14:
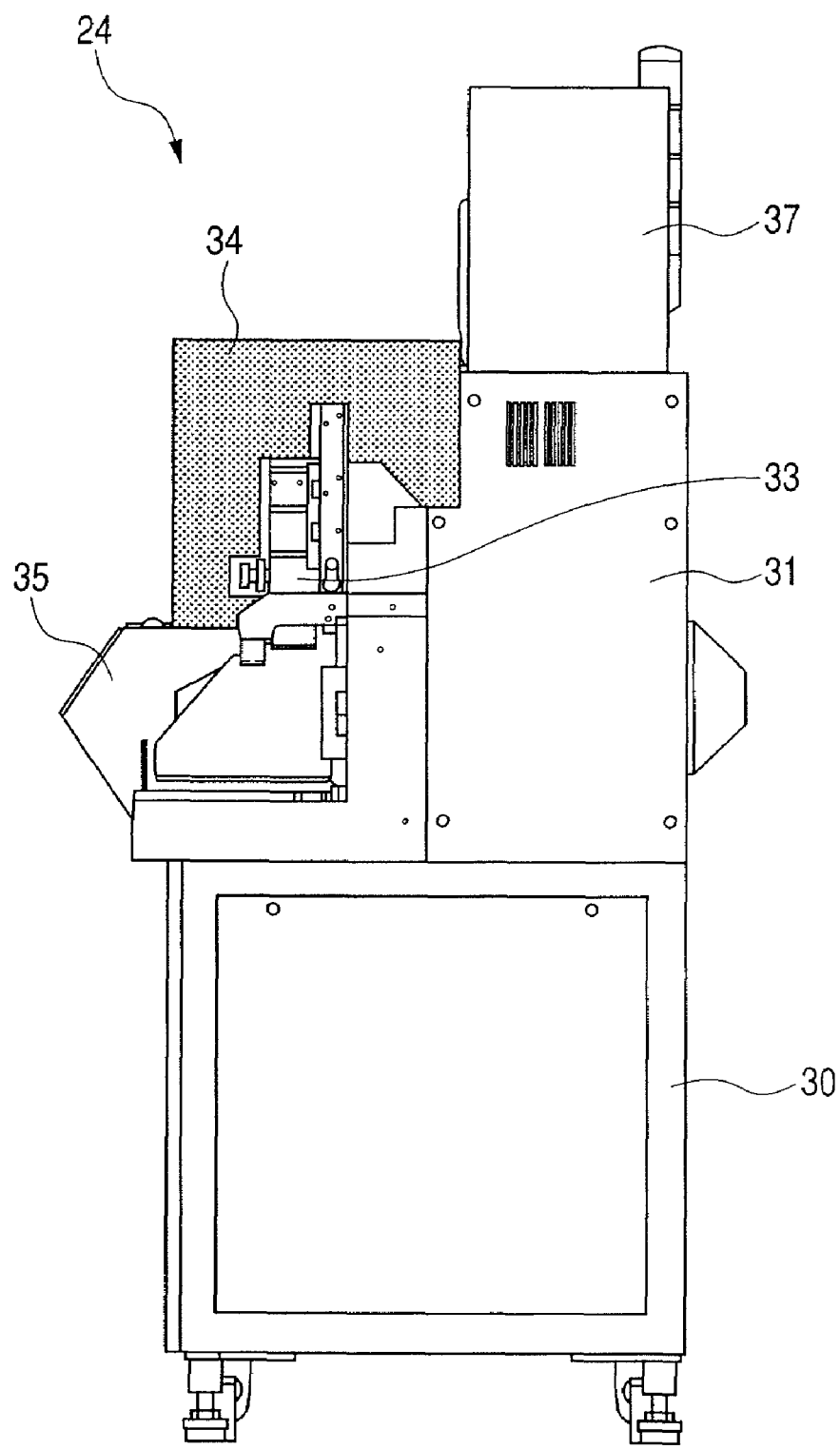
FIG. 14 is a side view showing the outer appearances of the wire bonding apparatus.

As shown in the front view of FIG. 13 and the side view of FIG. 14, the wire bonding apparatus 24 is externally comprised of a box part 30 configured as a case and a mechanism part 31 provided on the box part 30. The mechanism part 31 has a loader 32 on the left side of the front view of FIG. 13 and an unloader 33 on the right side thereof. The wire bonding apparatus 24 is constructed such that the multi-chip substrate 7 is supplied from the loader 32, wire bonding is performed in a wire bonder at the center which is not shown, and the multi-chip substrate 7 through the wire bonding is collected by the unloader 33 on the right side. Since a laser beam is emitted as described above, the laser beam shield cover 34 is removably attached to the wire bonder at the center such that the operator is not irradiated with the laser beam or a laser beam scattered after irradiation. In addition, a control box 35 having a control panel is disposed at the center.

Figure 15:
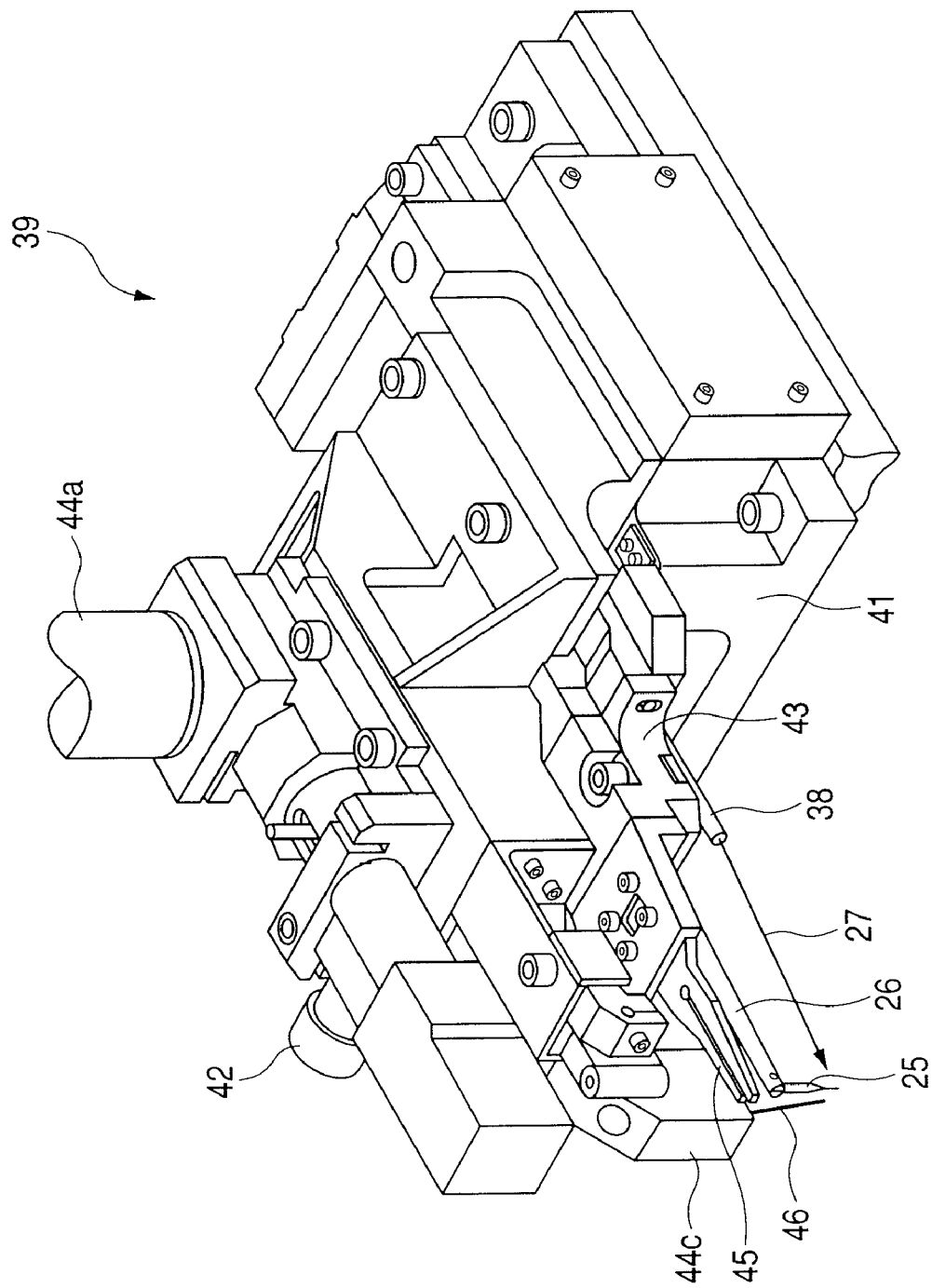
FIG. 15 is a perspective view showing the principal portion of the wire bonding apparatus.

As also shown in FIGS. 13 and 14, a laser oscillator 37 is provided in an upper right rear portion of each of the drawings when viewed from the front side. An oscillating laser beam from the laser oscillator 37 is guided to a desired position by a flexible optical fiber 38. As shown in FIG. 15, the tip of the optical fiber 38 is located under the horn 26 in juxtaposition therewith to irradiate the capillary 25 mounted on the tip of the horn 26 with the laser beam 27.

Figure 12:
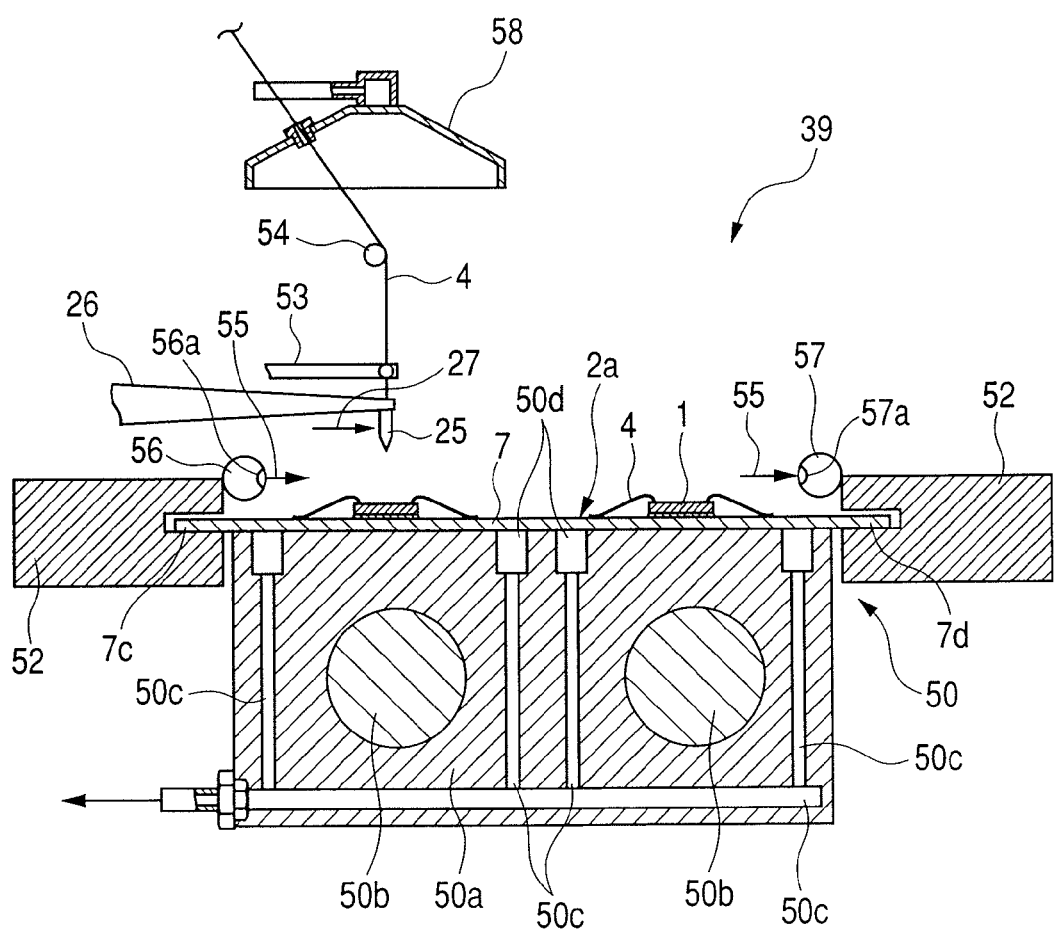
FIG. 12 is a schematic cross-sectional view showing the principal portion of a wire bonding apparatus used in the manufacturing of the BGA semiconductor device.
Figure 16:
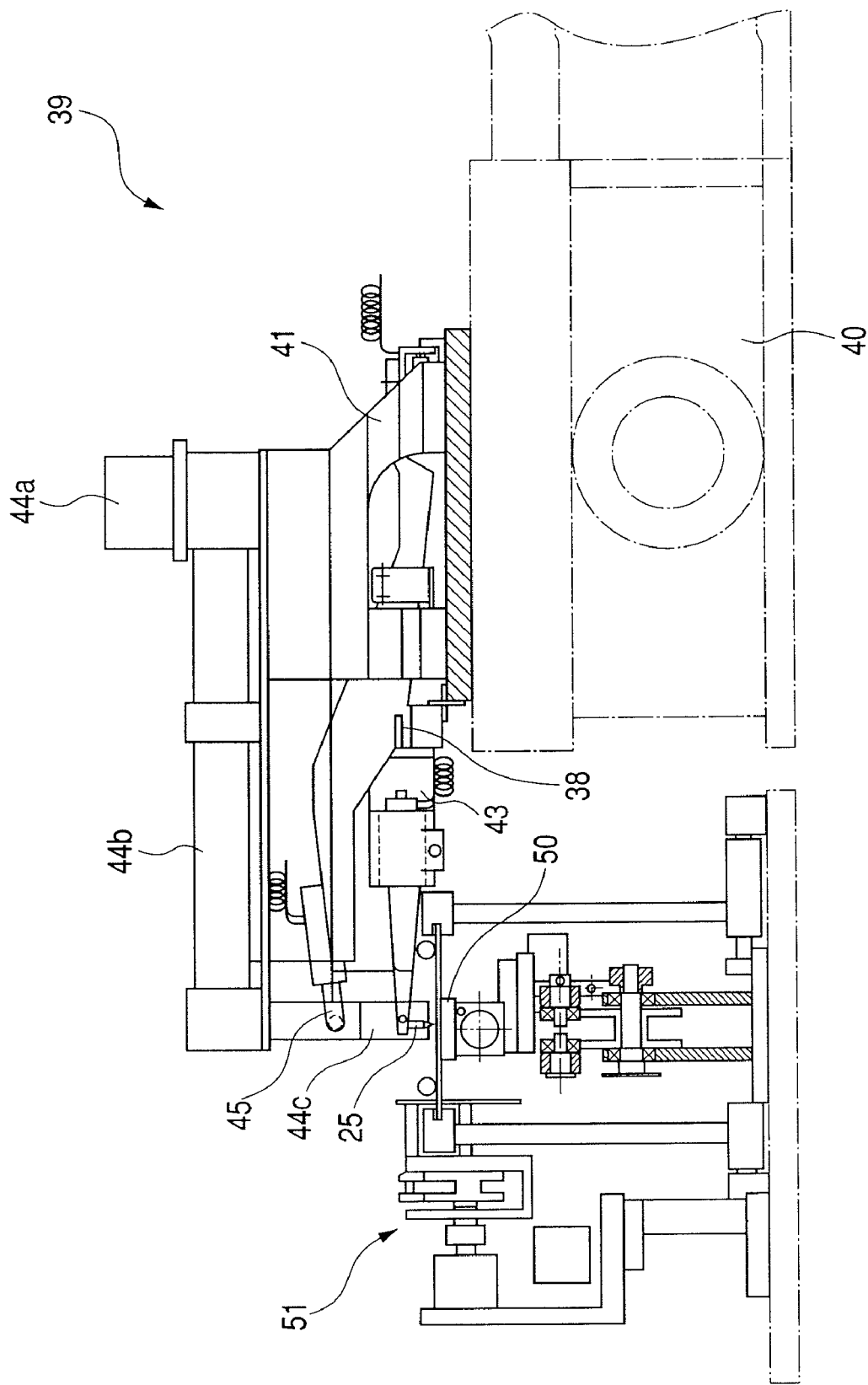
FIG. 16 is a side view showing the principal portion of the wire bonding apparatus.
Figure 17:
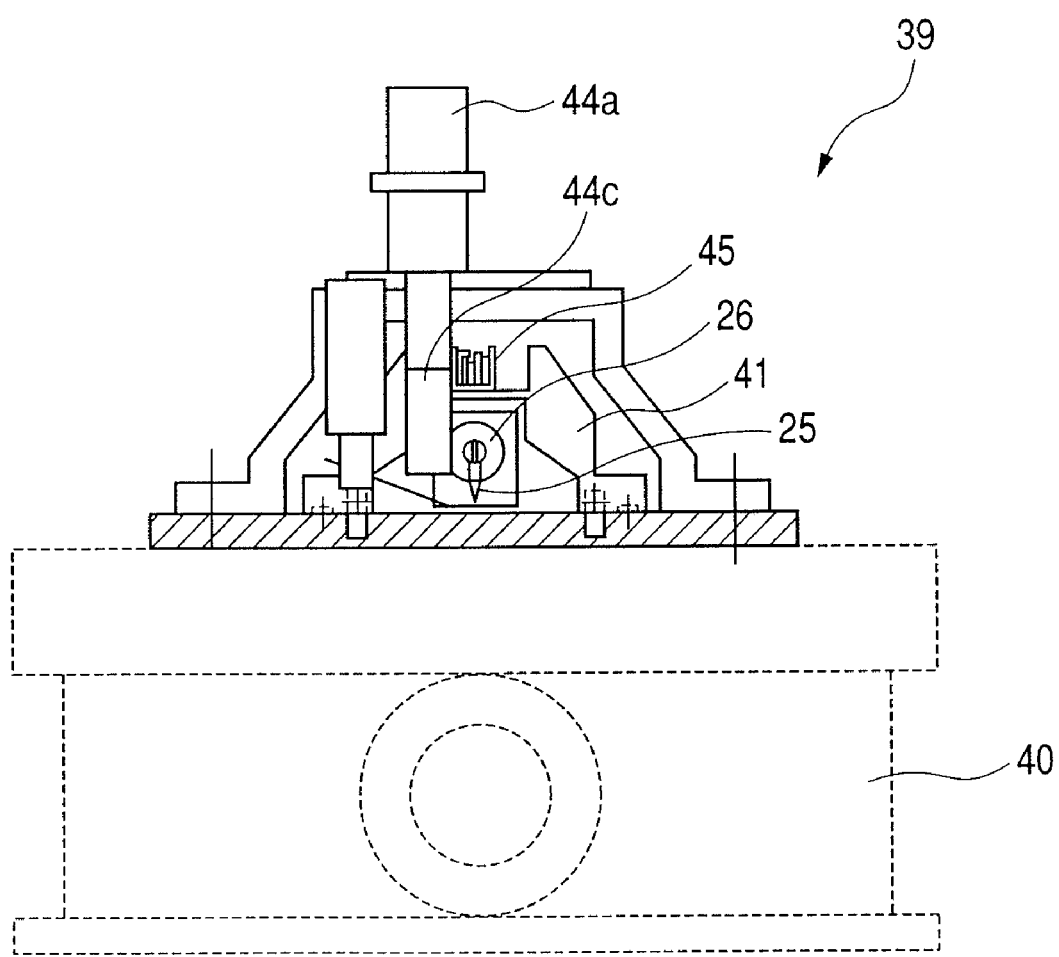
FIG. 17 is a front view showing the principal portion of the wire bonding apparatus.

A wire bonder 39 is so constructed as shown in the front view of FIG. 17, the side view of FIG. 16, the perspective view of FIG. 15, and the schematic cross-sectional view of FIG. 12. As shown in FIGS. 16 and 17, the wire bonder 39 has an XY table 40 serving as a base, the position of which can be controlled in horizontal XY directions. A driver 41 is mounted on the XY table 40. The driver 41 is provided with a lifter arm 43 having the horn 26 attached thereto and driven by a Z-axis motor 42 to swing in the horizontal XY directions or operate in a vertical Z direction; a monitor system (a camera 44a, a body tube 44c, and an optical system 44b coupling the camera 44a to the body tube 44c) for sensing a sample; a wire supply system 45 (including a spool for supplying a wire, a damper for gripping a wire, and the like each of which is partly shown in the drawing) for supplying and cutting the wire 4; and a discharge electrode 46 (see FIG. 15) for forming the tip of the wire 4 protruding from the lower end of the capillary 25 into a spherical configuration.

In the wire bonder 39, a bonding/transport system 51 including a wire bonding stage 50 on which a wiring substrate is placed as shown in FIG. 16 is disposed under the capillary 25 to correspond to the operation region of the capillary 25.

A brief description will be given herein below to the principal portion of the wire bonder 39 with reference to the cross-sectional view of FIG. 12. If an organic gas is generated in this example, a mechanism for exhausting the organic gas is provided.

The wire bonder comprises: the wire bonding stage 50 on which the multi-chip substrate 7 is placed during wire bonding; a transport rail 52 for supporting the first and second side portions 7c and 7d of the multi-chip substrate 7; the horn 26 positioned above the multi-chip substrate 7 to serve as a bonding arm with the capillary 25 provided at the tip thereof; a damper 53 for supplying/cutting the wire 4; an ejection pipe 56 provided in the vicinity of the first side portion 7c of the multi-chip substrate 7 to eject a gas 55; a suction pipe 57 provided in the vicinity of the second side portion 7d of the multi-chip substrate 7 to suck in the gas 55; and an exhaust duct 58 for sucking in the organic gas generated from the insulating layer of the multi-chip substrate 7 thereabove.

The wire bonding stage 50 is comprised of: a heat block 50a having a flat upper surface on which the multi-chip substrate 7 is placed; and a heater 50b inserted in a hole provided in the heat block 50a. In the heat block 50a, a lower exhaust pipe 50c for sucking in the organic gas generated below the multi-chip substrate 7 has been incorporated.

The arrangement allows, in the wire bonder, the formation of a flow of the gas 55 in a direction substantially orthogonal to the direction of transportation in a region above the multi-chip substrate 7 during wire bonding by ejecting the gas 55 such as a dry air from an ejection hole 56a in the ejection pipe 56 in the vicinity of the first side portion 7c of the multi-chip substrate 7 and sucking in the gas 55 from a suction hole 57a in a suction pipe 57 in the vicinity of the opposite second side portion 7d.

Even in a region below the multi-chip substrate 7, the organic gas generated below the multi-chip substrate 7 is sucked in from the lower exhaust pipe 50c.

By thus sucking in the gas 55 and the organic gas from the duct 58 and the suction hole 57a in the suction pipe 57 in the region above the multi-chip substrate 7, while sucking in the organic gas from the suction hole 50d in the lower exhaust pipe 50c in the region below the multi-chip substrate 7, the organic gas can be sucked in independently in each of the regions above and below the multi-chip substrate 7.

On the other hand, the capillary 25 is irradiated with the laser beam 27 emitted from the tip of the optical fiber 38, as stated previously. The spot beam of the laser beam 27 is, e.g., about 100 μm in size, with which the capillary 25 having a diameter of 1 mm and a length of 11 mm will be irradiated. The laser beam irradiation heats the capillary 25 and the accumulated heat heats the wire 4 held in the cylinder through heat conduction or radiation. The capillary 25 is heated to, e.g., about 200° C. Preferably, the capillary 25 is formed from an insulating ceramic material with a laser beam reflectivity lower than that of the wire 4. It is also preferable that the capillary 25 is formed from a material lower in thermal conductivity than the horn 26 in consideration of a heat accumulating property when laser beam heating is performed prior to the bonding step and the prevention of the heating of the horn 26 through heat diffusion toward the horn 26, so that the capillary 25 is formed from, e.g., an alumina-based ceramic ($Al_2O_3$). Each of the horn 26, the optical system 44b, and the body tube 44c is formed from a material having a thermal conductivity higher than that of the capillary 25 and resistant to heat-induced expansion such as Ti or a stainless steel to acquire high heat diffusivity. This is for preventing a change in the position of the capillary 25 due to the temperature and a change in the monitor system due to the temperature.

The laser oscillator 37 is constructed to oscillate in response to a pulse signal. Accordingly, an amount of heating can be controlled by changing a pulse number used to irradiate the capillary 25. The setting of the pulse number can be performed from the control panel of the control box 35. It is natural to increase the pulse number in the state in which the heater 50b is not operated and reduce the pulse number in the state in which the heater 50 is operated. The amount of heating changes depending on the magnitude of the output from the incorporated laser oscillator 37. In the case of operating the heater 50b, even a low-output laser oscillator 37 enables satisfactory wire bonding.

The wire bonding apparatus 24 according to Embodiment 1 can selectively use either of a method for performing wire bonding by heating the capillary 25 through laser beam irradiation without operating the heater 50b and a method for performing wire bonding by heating the capillary 25 through laser beam irradiation, while operating the heater 50 to heat the multi-chip substrate 7 at a lower temperature.

In the state in which the heater 50b is not operated, the horn 26, the optical system 44b, and the body tube 44c are not elongated by heat. As a result, the monitor system can sense the bonding position and the like with high accuracy and the position of the capillary 25 (the length measured from the portion fixed to the horn 26) does not change in a bonding system comprised of the horn 26. This enables high-accuracy wire bonding, improves a bonding yield, and thereby allows the low-cost manufacturing of the high-quality semiconductor device 9.

Even in the case of operating the heater 50b, Embodiment 1 heats the heat block 50a only to 130° C. (which has been heated conventionally to 200 to 250° C.) at the maximum by using the heater 50b. Accordingly, it becomes possible to perform the bonding step with high positional accuracy.

This resultantly obviates the necessity for the operation of ejecting the gas 55 from the ejection pipe 56 for exhausting the organic gas and the sucking operation from the suction pipe 57, the suction hole 50d, and the duct 58 in either of the state where the heater 50b is operated and the state where the heater 50b is not operated, reduces the running cost for the wire bonding apparatus, and thereby achieves a reduction in the manufacturing cost for the semiconductor device 9. However, the ejecting/sucking operations may also be performed for other reasons including the removal of a foreign substance.

Figure 18:
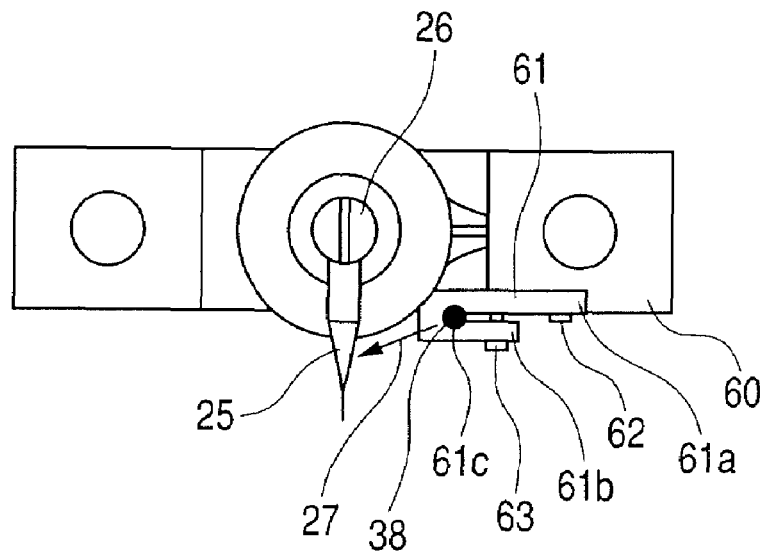
FIG. 18 is a schematic front view showing the location of a laser oscillator in the wire bonding apparatus.
Figure 19:
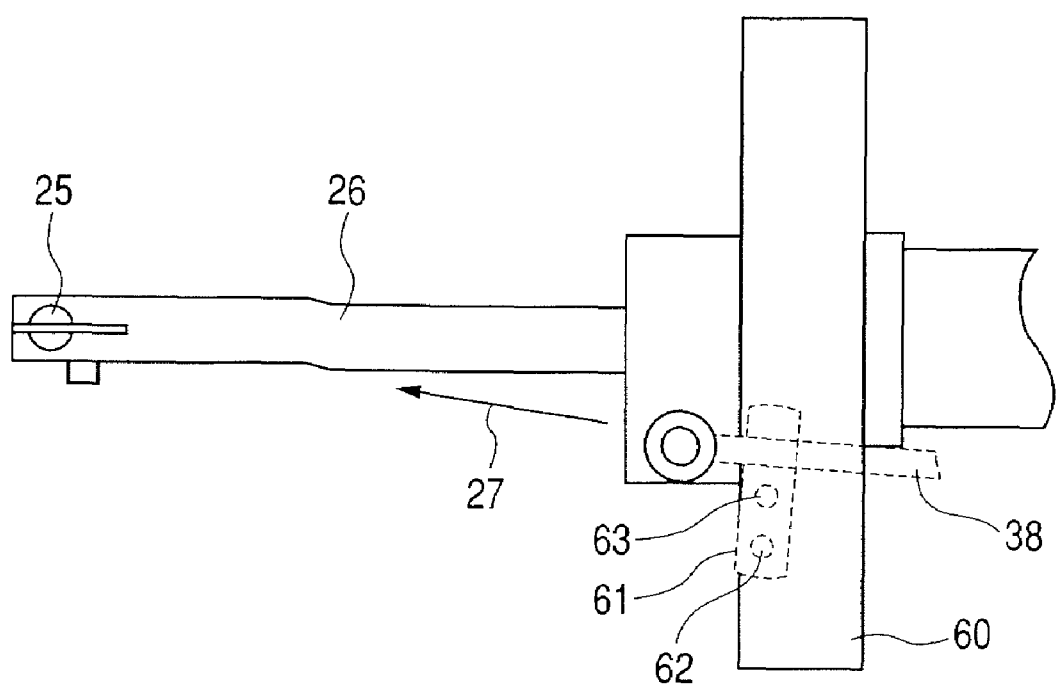
FIG. 19 is a schematic plan view showing the location of the laser oscillator in the wire bonding apparatus.

FIG. 18 is a schematic front view showing the location of the optical fiber 38 as a laser emitter and FIG. 19 is a schematic plan view thereof. By using a screw 62, a blanket 61 is fastened to the lower surface of a horn support 60 fixed onto the XY table 40 which follows the operation of the horn 26 in the XY directions to serve as a supporting point for the operation of a horn movable portion in the Z direction. By providing the portion which follows the operation of the horn 26 with the laser emitter, the provision of a synchronous deflection mechanism using a hexagonal prism for causing the laser beam to follow the operation of the horn 26 is no more necessary, so that the laser emitting mechanism is simplified. In comparison with the horn movable portion operating also in the direction of the Z axis, the adverse effect of the laser emitter on the operation of the horn 26 can be reduced by fixing the laser emitter to the horn support 60 fixed in the direction of the Z axis so that a reduction in accuracy during the bonding step is prevented.

In the case of fixing the laser emitter to the horn movable portion, the optical fiber 38 serving as a laser emitter relatively light in weight is fixed preferably to the lifter arm 43 serving as the horn movable portion in the vicinity of the horn support 60 such that the adverse effect on the horn 26 is reduced. By fixing the laser emitter to the portion which also follows the operation of the horn 26 in the direction of the Z axis such as the lifter arm 43, it becomes possible to irradiate the capillary 25 with the laser beam at an arbitrary time in the wire bonding step.

The blanket 61 is comprised of a base piece portion 61a to which the screw 62 is attached and a tightening piece portion 61b having a cantilever configuration which is folded over at one end of the base piece portion 61a to overlap the base piece portion 61a at a specified distance therefrom. A guide 61c comprised of a circular groove is provided in the folded portion to catch the optical fiber 38 therein. Fixation can be accomplished by inserting the tip portion of the optical fiber 38 in the guide 61c and screwing the tightening piece portion 61b to the base piece portion 61a by using the screw 63.

The blanket 61 is attached such that the laser beam 27 emitted from the tip of the optical fiber 38 reaches a desired position on the capillary 25 for irradiation. The guide 61c of the blanket 61 may also be formed with an angular portion to guide the laser beam 27 emitted from the tip of the optical fiber 38 to a desired position on the capillary 25. The blanket 61 may also be formed to have a housing structure such that the direction of the optical fiber 38 is finely adjusted by using a screw or the like.

Figure 20:
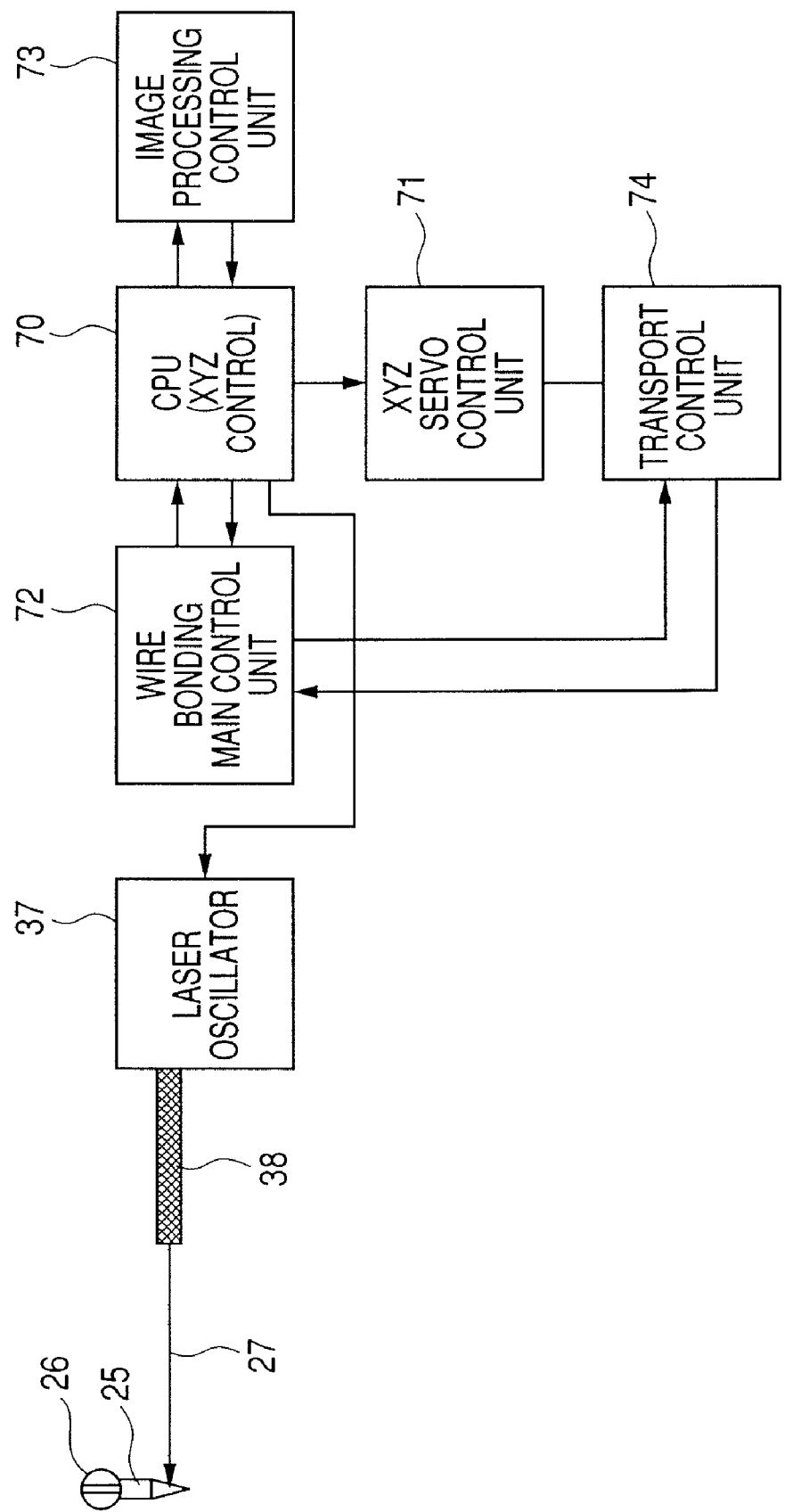
FIG. 20 is a block diagram showing the control system of the wire bonding apparatus.

FIG. 20 is a block diagram showing the control system of the wire bonder. A CPU (Central Processing Unit) 70 controls an XYZ servo control unit 71, a wire bonding main control unit 72, an image processing control unit 73, and the laser oscillator 37. The XYZ servo control unit 71 controls a transport control unit 74. The wire bonding main control unit 72 controls the transport control unit 74, while receiving transport information.

Under such control, the oscillating laser beam 27 from the laser oscillator 37 is guided by the flexible optical fiber 38 and emitted from the tip of the optical fiber 38 to the capillary 25 for irradiation. The tip portion of the optical fiber 38 is so constructed as to move following the horn 26, as described above.

Figure 21:
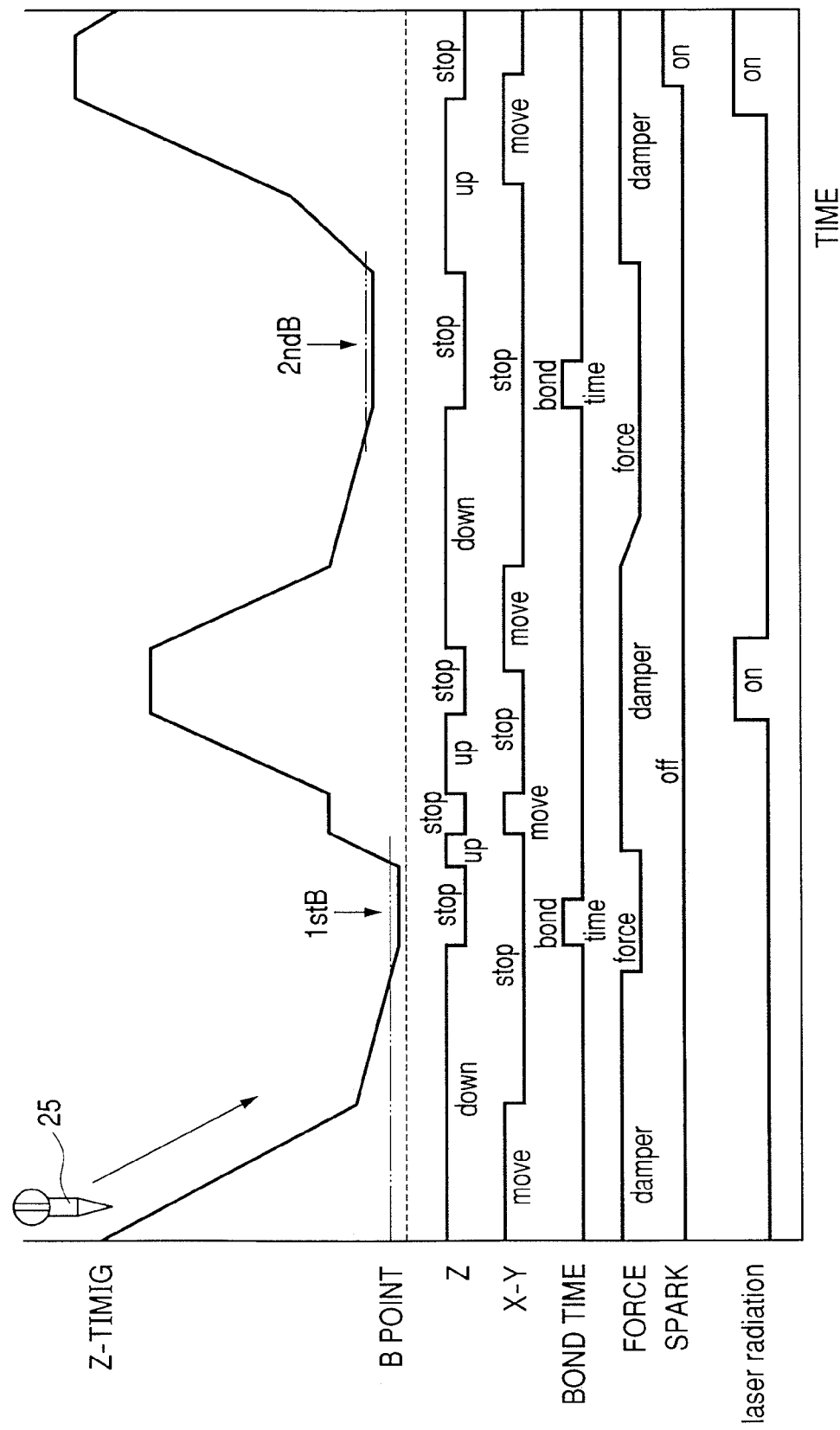
FIG. 21 is a timing chart showing the movement of a capillary and timings for laser oscillation in wire bonding.

FIG. 21 is a timing chart showing the movement of the capillary and timings for laser oscillation during wire bonding. In the timing chart, the vertical axis Z-TIMING represents the vertical movement of the capillary 25 and the vertical axis B POINT represents bonding heights in the first bonding (1stB) and the second bonding (2ndB). In addition, the vertical axis Z represents the vertical movement (up, down, and stop) of the capillary 25 in the Z direction, the vertical axis X-Y represents the movement (move and stop) of the capillary 25 in the horizontal XY directions, the vertical axis BOND TIME represents the time of bonding (bond time) using the capillary 25, the vertical axis FORCE represents a squashing operation (force and damper) resulting from the thermosonic bonding of the wire 4 performed by the capillary 25, the vertical axis SPARK represents the operation (on and off) of forming the tip of the wire 4 into a spherical configuration by discharging, and the vertical axis laser radiation represents the oscillating operation (on and off) performed by the laser oscillator, while the horizontal axis represents the time (TIME: seconds).

Figure 22:
FIG. 22 is a schematic diagram showing the state of a pulse inputted to the laser oscillator in laser beam irradiation.

The wire bonding apparatus according to Embodiment 1 is constructed such that, in the wire bonding operation, the dose of laser beam irradiation immediately before each of one to a plurality of wire bonding steps including the first one is higher than the dose of laser beam irradiation immediately before any of the subsequent wire bonding steps. FIG. 22 is a schematic diagram showing the number of pulse signals 80 inputted to the laser oscillator 37. In this example, the pulse number for heating immediately before the first wire bonding operation performed at the time of resuming an interrupted operation or performed after the substrate placing step for placing the substrate 2 with the semiconductor chip 1 mounted thereon on the wire bonding stage 50, i.e., immediately before the first one wire bonding has been set larger than the pulse number for heating immediately before the subsequent wire bonding. This is because, in the wire bonding step performed after the long interval A such as the one performed after the interrupted operation, the substrate placing step, or the like, the laser beam is emitted in a sufficient quantity for heating since heat has sufficiently dissipated from the capillary. By contrast, the quantity of the light beam emitted for irradiating the capillary is reduced in the wire bonding step performed continually after the shorter interval B or C for one chip in consideration of the effect of heat accumulation by the capillary, so that an excellent bonding state is realized.

In FIG. 22, heating immediately before the first wire bonding (First Bonding: 1stB) is performed by laser beam irradiation using the pulse signal 80 which is repeated five times and heating immediately before each of the subsequent wire bondings (Second Bonding: 2ndB and 1stB and 2ndB) is performed by laser beam irradiation using the pulse signal 80 which is repeated three times.

Next, as shown in FIG. 6(d), the cleaning of the multi-chip substrate 7 is performed. Here, the principal surface 2a of the package substrate 2 of the multi-chip substrate 7 is mainly cleaned by plasma cleaning (plasma etching). In that case, the multi-chip substrate 7 through wire bonding is placed in a chamber 20 and plasma cleaning is performed by using, e.g., an Ar gas. This can improve the adhesion of the principal surface 2a of the package substrate 2 to the molding resin.

Next, as shown in FIG. 6(e), resin molding is performed by using the upper and lower dies 21a and 21b of the molding die 21 of a transfer molding system. Resin molding is performed here after the wire bonding step and before a chip singulation step (i.e., the step of cutting the multi-chip substrate 7 along the edges of the product forming portions 7a for chip singulation).

That is, since the method for manufacturing a semiconductor device according to Embodiment 1 uses simultaneous molding, the plurality of semiconductor chips 1 and the bonding wires 4 are molded simultaneously before chip singulation. For the simultaneous molding, the upper die 21a (which may also be the lower die 21b) is formed with a large cavity 21c for collectively covering the plurality of semiconductor chips 1 mounted individually on the plurality of product forming portions 7a of the multi-chip substrate 7.

Accordingly, the multi-chip substrate 7 with the semiconductor chips 1 mounted on the respective product forming portions 7a is set between the upper and lower dies 21a and 21b of the molding die 21 and the plurality of product forming portions 7a are covered collectively with the single cavity 21c, as shown in FIG. 6(e). A molten insulating resin is supplied under pressure into the cavity 21c in this state to fill the inside of the cavity 21c therewith. Thereafter, the resin is cured to be set, thereby forming the insulating resin layer 8 for molding the semiconductor chips 1 and the bonding wires 4 (see FIG. 7(a)). For example, an epoxy-based thermosetting resin or the like is used as the molding resin.

If molding of each of the product forming portions 7a is performed individually instead of simultaneous molding, the molded body 6 is formed by resin molding on the principal surface 2a of the package substrate 2 which has preliminarily undergone chip singulation, whereby the semiconductor chips 1 and the bonding wires 4 are molded.

In either of the simultaneously molding and the individual molding of each of the product forming portions 7a, resin molding is performed such that the plurality of bump lands 2e on the back surface 2b of the package substrate 2 are not covered with the insulating resin layer 8 or the molded body 6. This allows the plurality of bump lands 2e to be exposed at the back surface 2b of the package substrate 2.

By providing the upper surface of the multi-chip substrate 7 including the plurality of product forming portions 7a covered with the cavity 21c with no opening penetrating therethrough in the state in which chip mounting has been completed by mounting the semiconductor chips 1 on the multi-chip substrate 7, it becomes possible to prevent the molding resin from reaching the back surface of the multi-chip substrate 7 when the molding resin is filled. By thus preventing the molding resin from reaching the back surface, the contamination of the back surface of the multi-chip substrate 7 or the bump lands 2e can be prevented.

Next, as shown in FIG. 7(a), the mounting of the ball electrodes 3 is performed. Here, a ball mounting jig 22 holding a plurality of vacuum-sucked balls 3a (e.g., solder balls) is positioned above the back surface 2b of the package substrate 2 of the multi-chip substrate 7 that has been disposed to face upward, thereby placing the balls 3a on the plurality of bump lands 2e on the back surface 2b of each of the package substrates 2 from above the multi-chip substrate 7. Then, the balls 3a are heated to be fixed to the bump lands 2e, thereby forming the ball electrodes 3. For example, the balls 3a are molten by infrared reflow to be attached to the individual bump lands 2e. The formation of the ball electrodes 3 may be performed either before or after dicing after the simultaneous molding.

Next, as shown in FIG. 7(b), the cleaning of the ball electrodes 3 is performed.

Next, as shown in FIG. 7(c), dicing is performed by using a cutting blade (dicing blade) 10. In the dicing, cutting is performed along the edges of the product forming portions 7a for chip singulation. As a result, a large number of BGA semiconductor devices 9 as shown in FIG. 7(d) are manufactured.

It is also possible to attach a dicing tape to the surface of the insulating resin layer 8 prior to the dicing, perform cutting to a depth corresponding to the midpoint of the dicing tape by using the dicing blade during the dicing, and then remove each of the semiconductor devices 9 from the dicing tape.

The method for manufacturing a semiconductor device according to Embodiment 1 achieves the following operations/working-effects.

(1) Since wire bonding is performed by heating the capillary 25 through laser beam irradiation immediately before the wire bonding and thereby heating the wire held by the capillary 25, it is unnecessary to heat the wire bonding stage 50. Consequently, the multi-chip substrate (organic resin wiring substrate) 7 on the wire bonding stage 50 is no more heated so that the generation of an organic gas and heat-induced expansion and deformation resulting from the heat of the substrate are less likely to occur. In addition, the laser beam irradiation is local and an amount of heat radiation to the surrounding environment is small. Accordingly, the heat-induced expansion of the horn 26 for supporting the capillary 25 and the optical system for monitoring the substrate portion is slight, which enables high-accuracy wire bonding. As a result, it becomes possible to manufacture the high-quality semiconductor device 9 at low cost due to the improved yield.

(2) In a wire bonding operation using the wire bonding apparatus 24, the dose of laser beam irradiation immediately before each of one to a plurality of wire bonding steps including the first one is higher than the dose of laser beam irradiation immediately before any of the subsequent wire bonding steps. Accordingly, the capillary 25 heated from a room temperature to a specified temperature is heated sufficiently even at the initial stage so that excellent wire bonding is performed. Since the dose of laser irradiation is reduced thereafter, there is no situation in which the wire bonding property is degraded by the excessive heating of the wire 4. As a result, it becomes possible to perform high-accuracy bonding and manufacture the high-quality semiconductor device 9.

(3) At the time of resuming an interrupted operation also, the dose of laser beam irradiation immediately before each of one to a plurality of wire bonding steps is high and becomes small thereafter. This constantly enables excellent wire bonding and allows the manufacturing of the high-quality semiconductor device 9.

(4) Since the wire bonding apparatus 24 is provided with the laser shield cover 34 for shielding the laser beam 27 from being scattered to the outside, the operator is protected from being irradiated with the scattered laser beam so that safety is guaranteed.

(5) When wire bonding is performed without heating the multi-chip substrate 7 as the organic resin wiring substrate on the wire bonding stage 50 in the present embodiment, an organic gas is not generated from the organic resin wiring substrate so that an operation environment free from contamination by the organic gas is obtainable.

(6) Even when the multi-chip substrate 7 as the organic resin wiring substrate is heated on the wire bonding stage 50 in the present embodiment, the wire bonding stage 50 is heated to a low temperature of 130° C. or less so that an organic gas is not generated from the organic resin wiring substrate and an operation environment free from contamination by the organic gas is obtainable.

Embodiment 2

Figure 23:
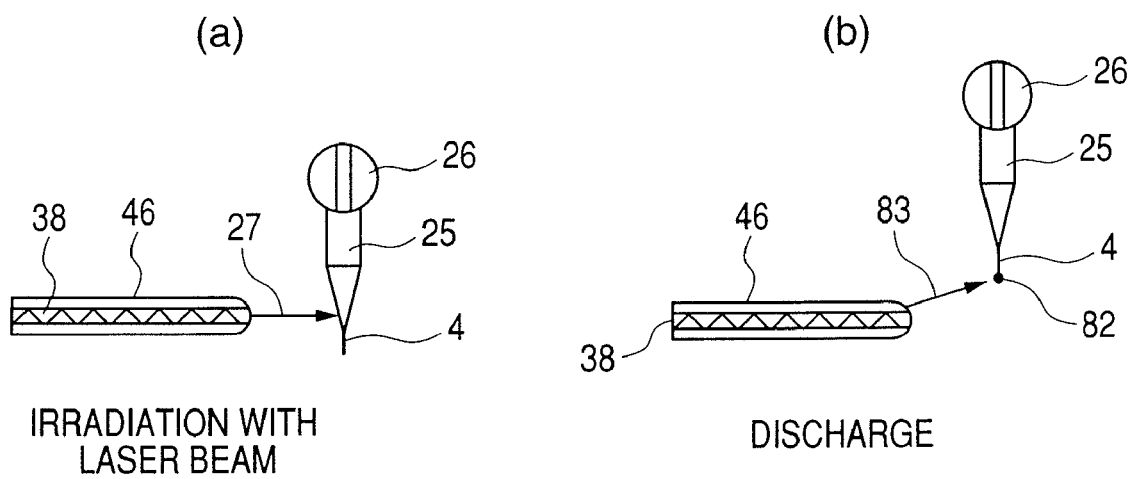
FIGS. 23(a) and 23(b) are schematic diagrams each showing a capillary heating mechanism using laser irradiation in a wire bonding apparatus according to another embodiment (Embodiment 2) of the present invention.

FIGS. 23(a) and 23(b) are schematic diagrams each showing a capillary heating mechanism through laser irradiation in a wire bonding apparatus according to another embodiment (Embodiment 2) of the present invention. In thermocompression wire bonding, the capillary 25 is configured as a cylinder so that connection is provided by guiding the wire 4 into the cylinder and squashing the wire 4 onto the portion to be bonded under the lower surface (wire compression surface) of the capillary 25. In a thermosonic wire bonding method, ultrasonic vibration is added during the squashing.

In the first bonding (1stB), the tip of the wire 4 protruding from the wire compression surface of the capillary 25 is formed into a spherical configuration for the squashing of the wire 4. As a spherization mechanism for forming the spherical portion, there is known a method which forms the spherical portion through a melting process using a hydrogen flame or a method which brings the discharge electrode 46 closer to the lower end of the wire 4 protruding from the lower surface of the capillary 25, causes discharging between the wire 4 and the discharge electrode 46, and thereby forms a spherical portion 82.

In view of this, the discharge electrode 46 is constructed as a cylindrical body in Embodiment 2 such that the optical fiber 38 is inserted in the cylindrical body and fixed to have the tip thereof exposed. The optical fiber 38 extends from the laser oscillator 37 in the wire bonding apparatus 24 according to Embodiment 1, guides the oscillating laser 27 beam from the laser oscillator 37, and emits the laser beam 27 from the tip thereof.

FIG. 23(a) is a view showing the state of laser beam irradiation for heating the capillary 25 by irradiating the capillary 25 with the laser beam 27. FIG. 23(b) is a view showing the state in which the tip of the wire 4 is formed into the spherical portion 82 by generating a spark 83 between the discharge electrode 46 and the wire 4. The heating of the capillary 25 through laser beam irradiation may be either before or after the discharge. However, it is superior to heat the capillary 25 through laser beam irradiation after forming the spherical portion 82 by discharging and perform wire bonding immediately thereafter in terms of a slight reduction in the temperature of the capillary 25.

Embodiment 2 also enables excellent wire bonding.

Although the invention achieved by the present inventor has been described specifically based on the embodiments thereof, the present invention is not limited thereto. It will easily be appreciated that various changes and modifications can be made in the invention without departing from the gist thereof.

The present invention is applicable at least to a method for manufacturing a semiconductor device using wire bonding by a thermocompression method.

The following is the brief description of effects achievable by the representative aspects of the invention disclosed in the present application.

(1) There can be provided a method for manufacturing a semiconductor device which allows the obtention of an excellent wire bonding property.

(2) There can be provided a semiconductor device which allows the obtention of an excellent wire bonding property.

(3) There can be provided a method for manufacturing a semiconductor device using an organic resin wiring substrate which allows the obtention of an excellent wire bonding property.

(4) Even in the method for manufacturing the semiconductor device using the organic resin wiring substrate, an operation environment free from contamination by an organic gas is obtainable.

INDUSTRIAL APPLICABILITY

As described above, a method for manufacturing a semiconductor device according to the present invention is a technology applicable to a method which provides connection between the electrode of a semiconductor element and a lead with a wire in the manufacturing of a semiconductor device and particularly useful when applied to thermosonic wire bonding.

What is claimed is:

1. A method for manufacturing a semiconductor device, comprising the steps of:

providing a wire bonding apparatus having a holder comprised of $Al_2O_3$, and a capillary held by said holder and comprised of Ti;
providing a semiconductor chip having a main surface, a back surface, and an electrode formed over said main surface;
providing a substrate having a line;
fixing said semiconductor chip onto said substrate;
heating said capillary covering a wire from therearound with a laser beam; and
electrically connecting the electrode of said semiconductor chip to said line through said wire by using said capillary.

2. A method according to claim 1, wherein said capillary has a thermal conductivity lower than that of the holder.

3. A method according to claim 1, wherein said substrate has a base material made of organic resin.

4. A method according to claim 1, wherein said substrate is comprised of a Cu lead frame.

* * * * *